United States Patent
Cheng et al.

(10) Patent No.: US 12,426,390 B2
(45) Date of Patent: Sep. 23, 2025

(54) PASSIVATION FOR A VERTICAL TRANSFER GATE IN A PIXEL SENSOR

(71) Applicant: Taiwan Semiconductor Manufacturing Company, Ltd., Hsinchu (TW)

(72) Inventors: Yu-Hung Cheng, Tainan (TW); Tzu-Jui Wang, Fengshan (TW); Ching I. Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 442 days.

(21) Appl. No.: 17/822,600

(22) Filed: Aug. 26, 2022

(65) Prior Publication Data

US 2024/0072082 A1    Feb. 29, 2024

(51) Int. Cl.
  *H10F 39/00*    (2025.01)
  *H10F 39/18*    (2025.01)

(52) U.S. Cl.
  CPC ..... *H10F 39/80373* (2025.01); *H10F 39/014* (2025.01); *H10F 39/028* (2025.01); *H10F 39/182* (2025.01); *H10F 39/8053* (2025.01); *H10F 39/8063* (2025.01); *H10F 39/807* (2025.01)

(58) Field of Classification Search
None
See application file for complete search history.

(56) References Cited

U.S. PATENT DOCUMENTS

| | | | |
|---|---|---|---|
| 2015/0243763 A1* | 8/2015 | Cheng | H10D 64/513 438/300 |
| 2016/0284746 A1* | 9/2016 | Fukase | H10F 39/80373 |
| 2020/0411585 A1* | 12/2020 | Huang | H10F 39/805 |
| 2021/0193704 A1* | 6/2021 | Sun | H10F 39/8037 |
| 2023/0067685 A1* | 3/2023 | Zang | H10F 39/80373 |
| 2023/0230872 A1* | 7/2023 | Chen | H10F 39/8067 257/510 |

* cited by examiner

*Primary Examiner* — Benjamin P Sandvik
(74) *Attorney, Agent, or Firm* — Harrity & Harrity, LLP

(57) ABSTRACT

A boron (B) layer may be formed as a passivation layer in a recess in which a vertical transfer gate is to be formed. The recess may then be filled with a gate electrode of the vertical transfer gate over the passivation layer (and/or one or more intervening layers) to form the vertical transfer gate. The passivation layer may be formed in the recess by epitaxial growth. The use of epitaxy to grow the passivation layer enables precise control over the profile, uniformity, and boron concentration in the passivation layer. Moreover, the use of epitaxy to grow the passivation layer may reduce the diffusion length of the passivation layer into the substrate of the pixel sensor, which provides increased area in the pixel sensor for the photodiode.

20 Claims, 38 Drawing Sheets

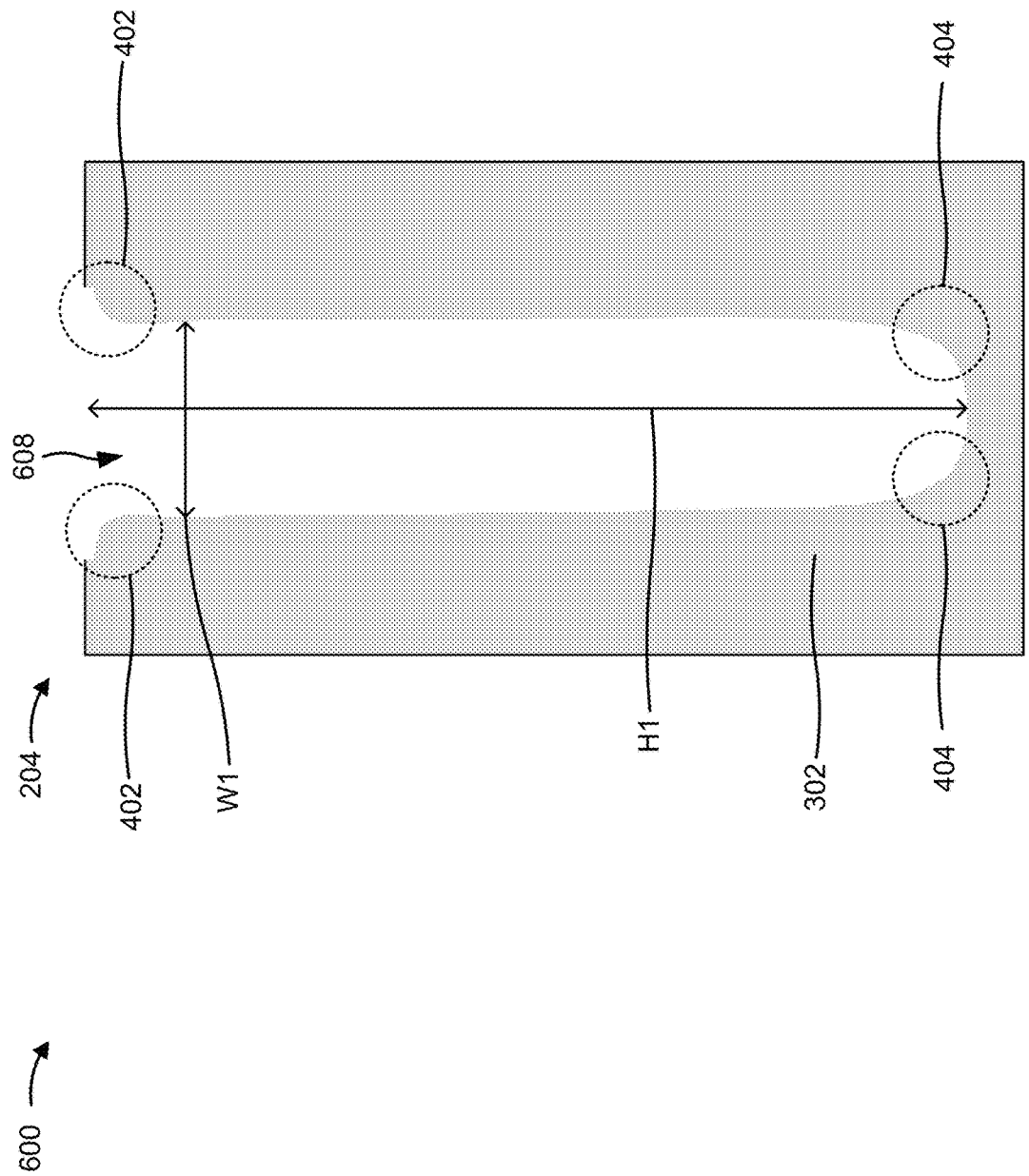

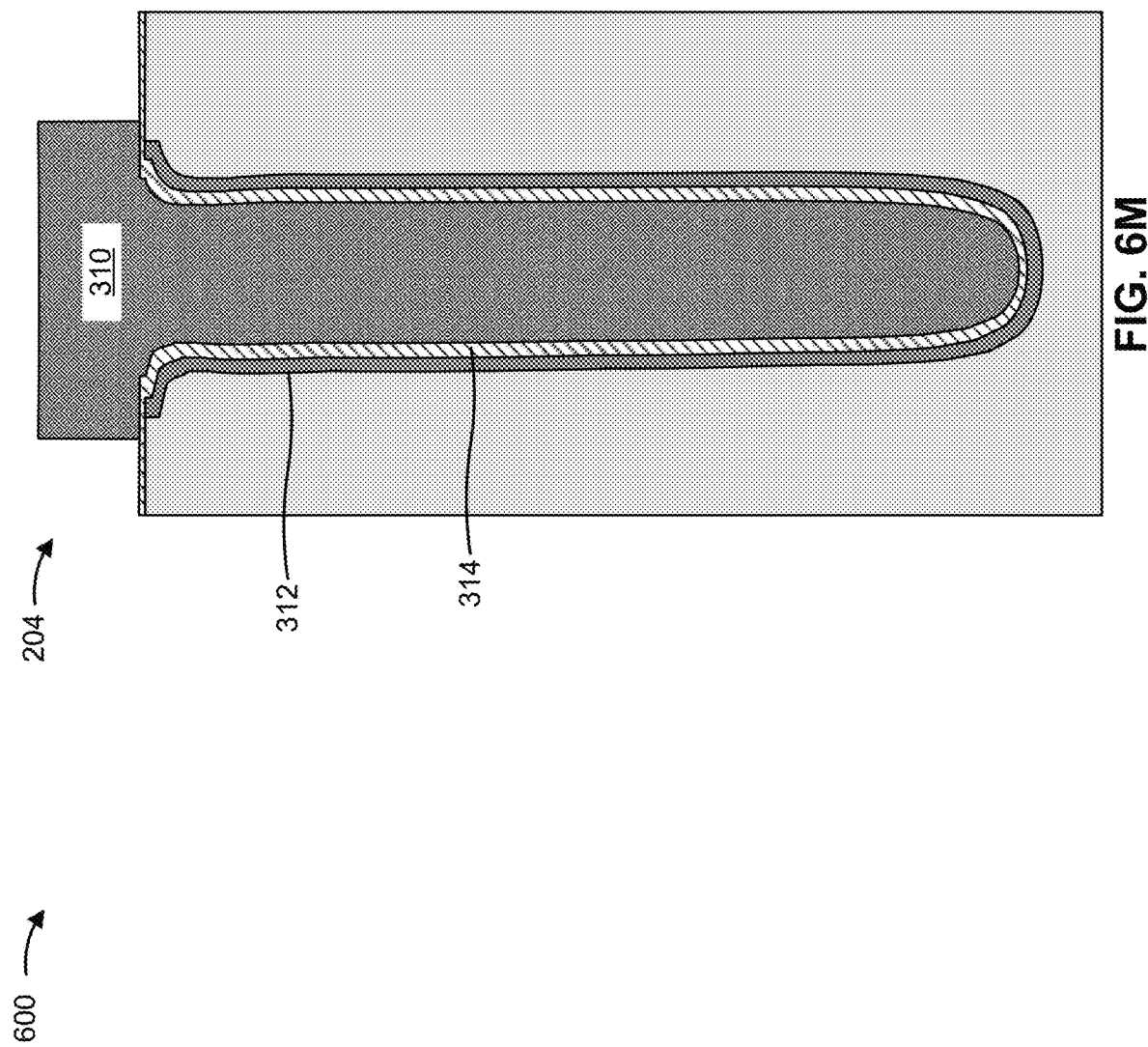

PASSIVATION FOR A VERTICAL TRANSFER GATE IN A PIXEL SENSOR

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6M are diagrams of an example implementation described herein.

DETAILED DESCRIPTION

Figure 1:
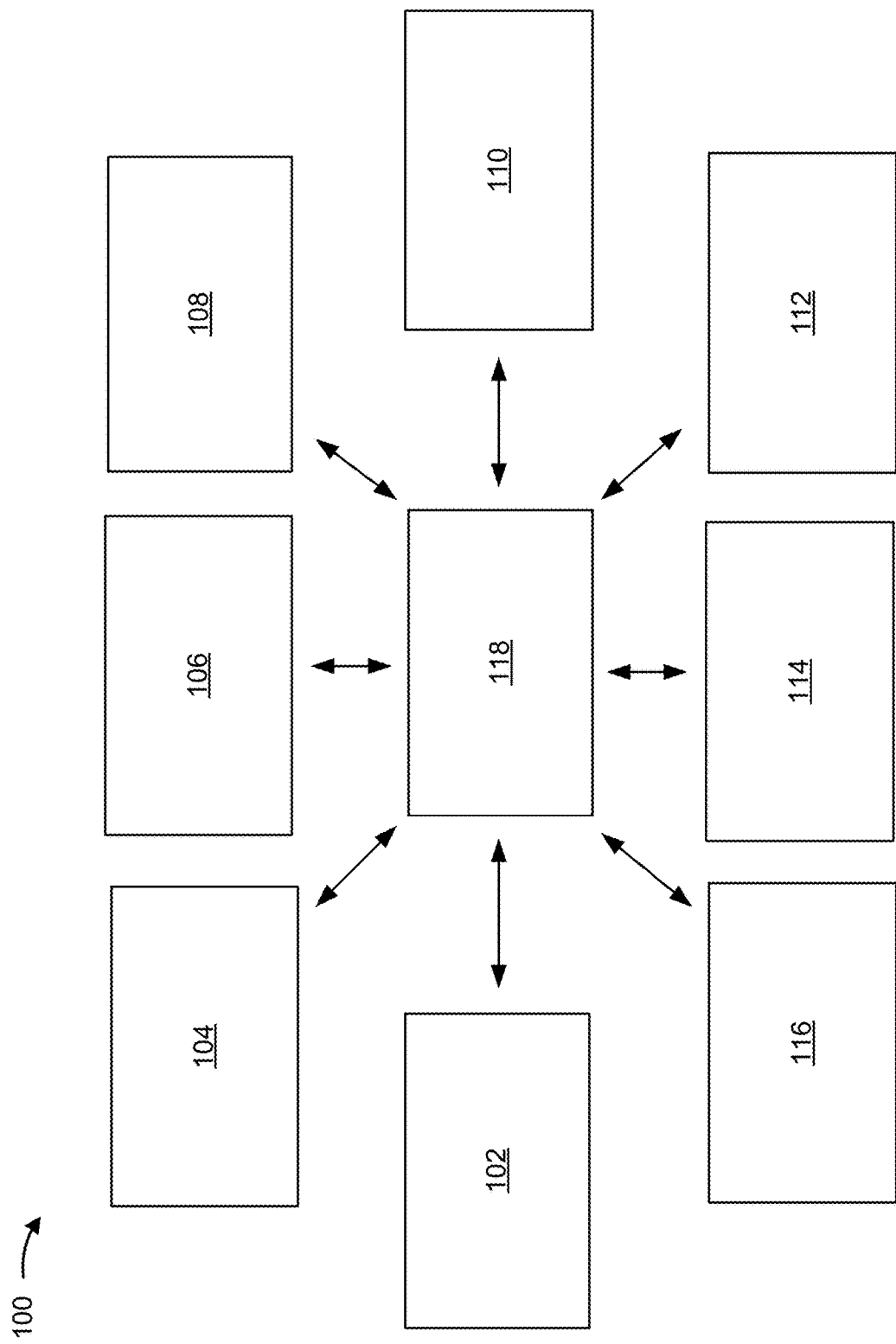
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transfer gate is a component of a pixel sensor that controls the transfer of a photocurrent from a photodiode of the pixel sensor to a drain region of the pixel sensor. The pixel sensor may operate as a transistor, in which the photodiode corresponds to the source of the transistor, the transfer gate corresponds to the gate of the transistor, and the drain region corresponds to the drain of the transistor. The transfer gate controls the transfer of the photocurrent by selectively forming a conductive channel in a substrate between the photodiode and the drain region.

In some cases, a planar transfer gate may used, where the planar transfer gate is located on the substrate between the photodiode and the drain region. Alternatively, a vertical transfer gate may be used. A vertical transfer gate is a type of transfer gate that extends into the substrate to increase the depth of the channel into the substrate. This increases the efficiency of the pixel sensor in that the increased depth of the channel enables a greater amount of electrons to be directed to the drain region as opposed to being diffused into the substrate and not collected at the drain region.

However, forming the vertical transfer gate into the substrate may result in the formation of silicon dangling bonds in the substrate. The silicon dangling bonds may line the vertical transfer gate and may act as recombination centers that result in electron and/or photon diffusion into the vertical transfer gate. This may reduce the quantity of photons absorbed in the photodiode and/or may reduce the amount of electrons that are transferred from the photodiode to the drain region, which may reduce the sensitivity of the pixel sensor, may increase dark current levels for the pixel sensor, and/or may reduce optical responsivity of the pixel sensor, among other examples.

Some implementations described herein provide passivation techniques and layers for a vertical transfer gate in a pixel sensor of a pixel array. As described herein, a boron (B) layer may be formed as a passivation layer in a recess in which the vertical transfer gate is to be formed. The recess may then be filled with a gate electrode of the vertical transfer gate over the passivation layer (and/or one or more intervening layers) to form the vertical transfer gate.

The passivation layer described herein results in formation of a boron-silicon interface between the vertical transfer gate and a photodiode of the pixel sensor. The boron atoms in the boron layer form strong chemical bonds with the silicon atoms in the silicon of a substrate in which the photodiode is formed, which reduces the quantity of silicon dangling bonds that would otherwise act as recombination centers. The boron-silicon interface functions as a diode junction having unique heterojunction properties as a result of the electronegativity difference between the boron atoms of the boron layer and the silicon atoms of the substrate. Thus, the boron-silicon interface resists penetration of photons and/or electrons into the vertical transfer gate. This reduces dark current levels of the pixel sensor, may increase optical responsivity of the pixel sensor, and/or may increase the sensitivity of the pixel sensor, among other examples.

As described herein, the passivation layer may be formed in the recess by epitaxial growth. The use of epitaxy to grow the passivation layer enables precise control over the profile, uniformity, and boron concentration in the passivation layer. Moreover, the use of epitaxy to grow the passivation layer may reduce the diffusion length of the passivation layer into the substrate of the pixel sensor, which provides increased area in the pixel sensor for the photodiode. The increased area in the pixel sensor for the photodiode may enable the size of the photodiode to be increased, which may increase full well capacitance (FWC) for the vertical transfer gate.

As described herein, the recess in which the passivation layer is formed may be formed to a particular shape and/or profile so that the breakdown voltage ($V_{BD}$) of the vertical transfer gate formed in the recess may be increased. The top and/or bottom corners of the recess may be rounded through the use of epitaxy, etch back, and/or annealing techniques described herein.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form, in a substrate, a photodiode for a pixel sensor of a pixel array; may form, in the substrate, a drain region for the pixel sensor; may form, in the substrate, a recess adjacent to the drain region; may epitaxially grow, on sidewalls of the recess and on a bottom surface of the recess, a passivation layer that includes boron; may form a gate dielectric layer over the passivation layer; and/or may form a gate electrode, of a vertical transfer gate of the pixel sensor, in the recess over the passivation layer, among other examples.

As another example, one or more of the semiconductor processing tools 102-116 and/or the wafer/die transport tool 118 may form a photodiode in a silicon substrate of a pixel sensor; may form a drain region in the silicon substrate; may form a vertical transfer gate that extends into the silicon substrate, the vertical transfer gate including a gate electrode; a passivation layer that includes boron, where the passivation layer is included between the silicon substrate and the gate electrode, and where a diffusion length of the passivation layer into the silicon substrate is less than a width of the gate electrode; and a gate dielectric layer between the passivation layer and the gate electrode, among other examples.

As another example, one or more of the semiconductor processing tools 102-116 and/or the wafer/die transport tool 118 may form, in a substrate, a photodiode for a pixel sensor of a pixel array; may form, in the substrate, a drain region for the pixel sensor; may form, in the substrate, a recess adjacent to the drain region, where the recess is formed such that at least one of a top corner of the recess or a bottom corner of the recess includes a combination of a (311) facet and a (111) facet; may form, on sidewalls of the recess and on a bottom surface of the recess, a passivation layer that includes boron; may form a gate dielectric layer over the passivation layer; and/or may form a gate electrode, of a vertical transfer gate of the pixel sensor, in the recess over the passivation layer, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
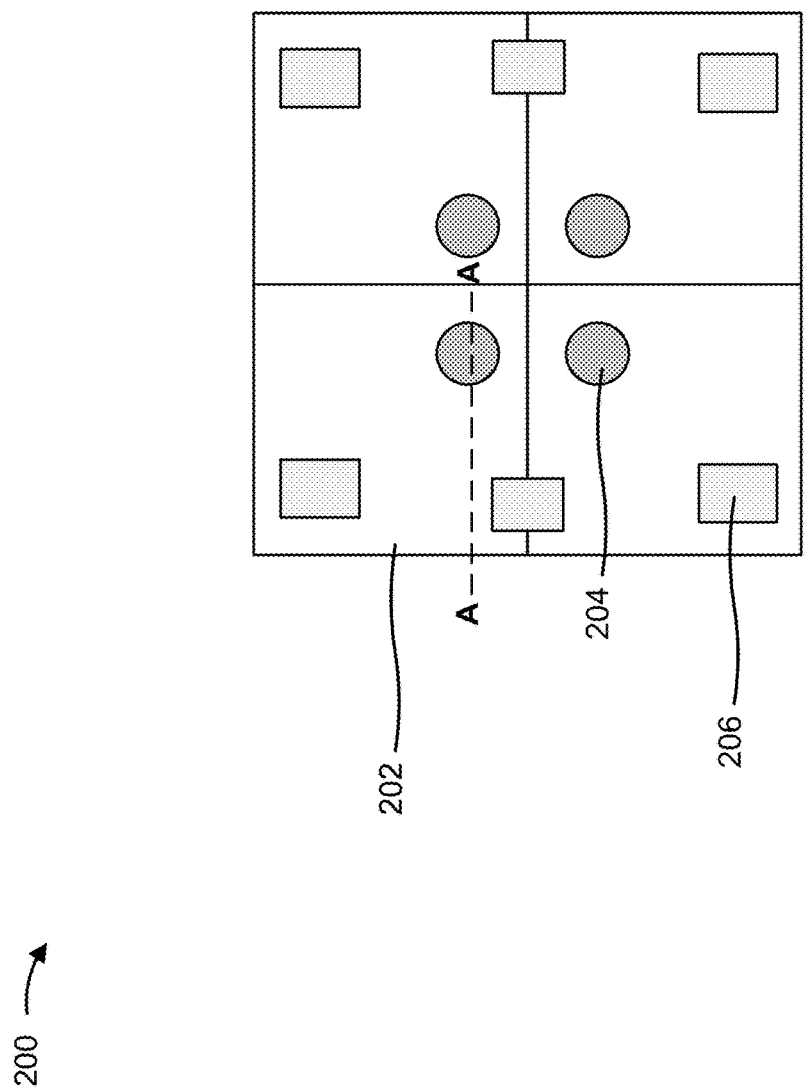
FIGS. 2A and 2B are diagrams of an example pixel array described herein.
Figure 2B:
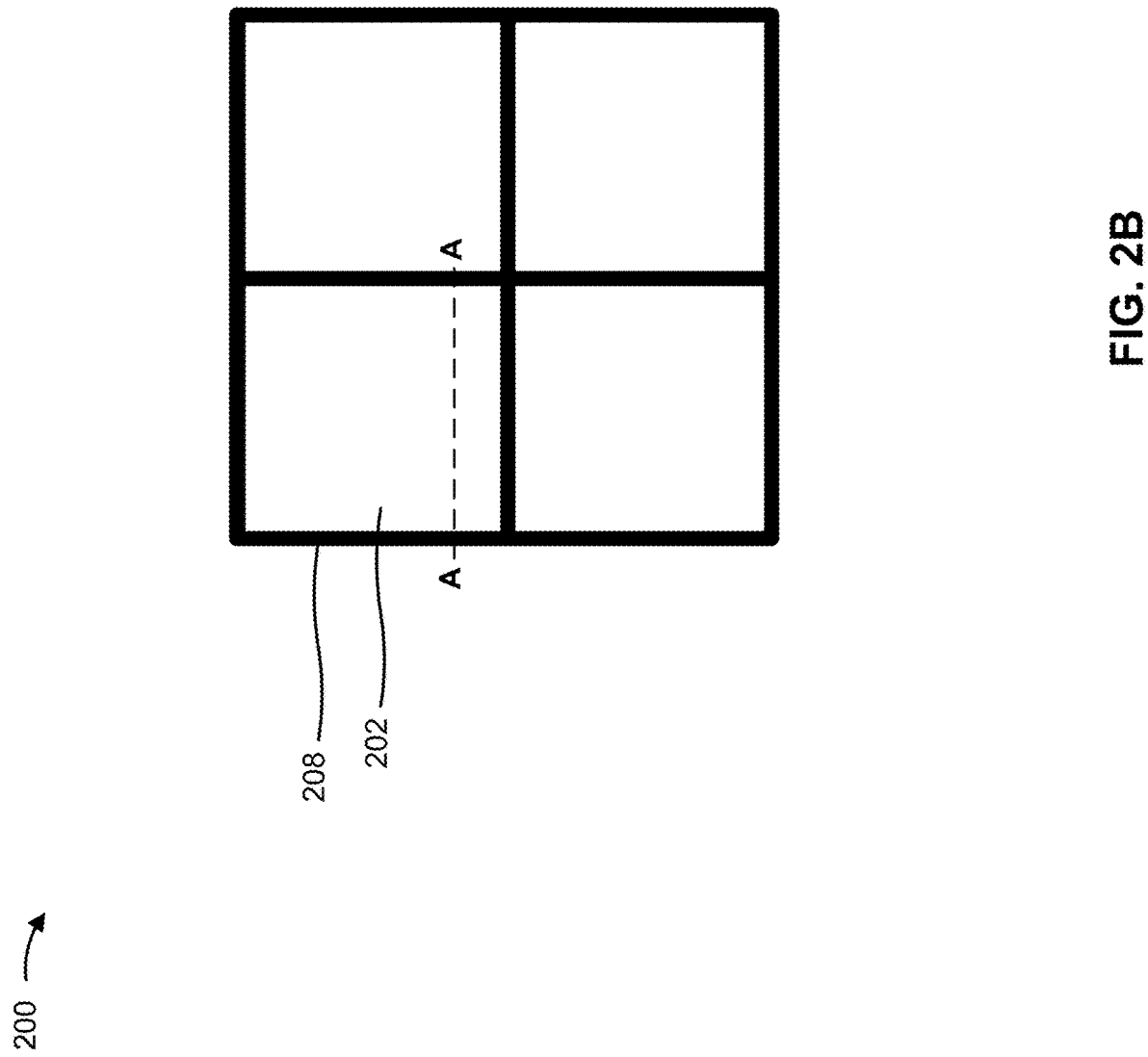

FIGS. 2A and 2B are diagrams of an example pixel array 200. FIG. 2A illustrates a top-down view of the pixel array 200. FIG. 2B illustrates a bottom-up view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor.

As shown in FIG. 2A, the pixel array 200 may include a plurality of pixel sensors 202. As further shown in FIG. 2A, the pixel sensors 202 may be arranged in a grid. In some implementations, the pixel sensors 202 are square-shaped (as shown in the example in FIG. 2A). In some implementations, the pixel sensors 202 include other shapes such as rectangle shapes, circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) of the pixel sensors 202 is approximately 1 micron. In some implementations, the size of the pixel sensors 202 (e.g., the width or the diameter) of the pixel sensors 202 is less than approximately 1 micron, such as approximately 0.4 microns or less. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

Each pixel sensor 202 may include one or more transistors. The transistor(s) may be configured to perform one or more functions, such as controlling the propagation of a photocurrent of a pixel sensor 202, discharging a pixel sensor 202, resetting a pixel sensor 202, and/or another function. Each of the pixel sensors 202 may include a vertical transfer gate 204 that is configured to control the propagation of photocurrent in the pixel sensors 202. Active pixel sensor (APS) transistors 206 may be located in one or more pixel sensors 202 to actively bias the one or more pixel sensors 202.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal. For a BSI CMOS image sensor, a transistor layer may be located between the BEOL metallization stack layers and a lens layer. For an FSI CMOS image sensor, the BEOL metallization stack layers may be located between the transistor layer and the lens layer.

As shown in FIG. 2B, the pixel sensors 202 may be electrically and optically isolated by a deep trench isolation (DTI) structure 208 included in the pixel array 200. The DTI structure 208 may include a plurality of interconnected trenches that are filled with a dielectric material such as an oxide. The trenches of the DTI structure 208 may be included around the perimeters of the pixel sensors 202 such that the DTI structure 208 surrounds the pixel sensors 202 (and the photodiodes and drain regions included therein), as shown in FIG. 2. Moreover, the trenches of the DTI structure 208 may extend into a substrate in which the pixel sensors 202 are formed to surround the photodiodes and other structures of the pixel sensors 202 in the substrate. As indicated above, the pixel array 200 may be included in a BSI CMOS image sensor. In these examples, the DTI structure 208 may include a backside DTI (BDTI or BSDTI) structure with a high aspect ratio that is formed from the backside of the pixel array 200.

FIGS. 2A and 2B further illustrate a reference cross-section A-A that is used in one or more figures described herein, such as one or more of FIGS. 3A-8C. Cross-section A-A is in a plane across a pixel sensor 202 of the pixel array 200. Subsequent figures refer to this reference cross-section for clarity. In some figures, some reference numbers of components or features illustrated therein may be omitted to avoid obscuring other components or features for ease of depicting the figures.

As indicated above, FIGS. 2A and 2B are provided as one or more examples. Other examples may differ from what is described with regard to FIGS. 2A and 2B.

Figure 3A:
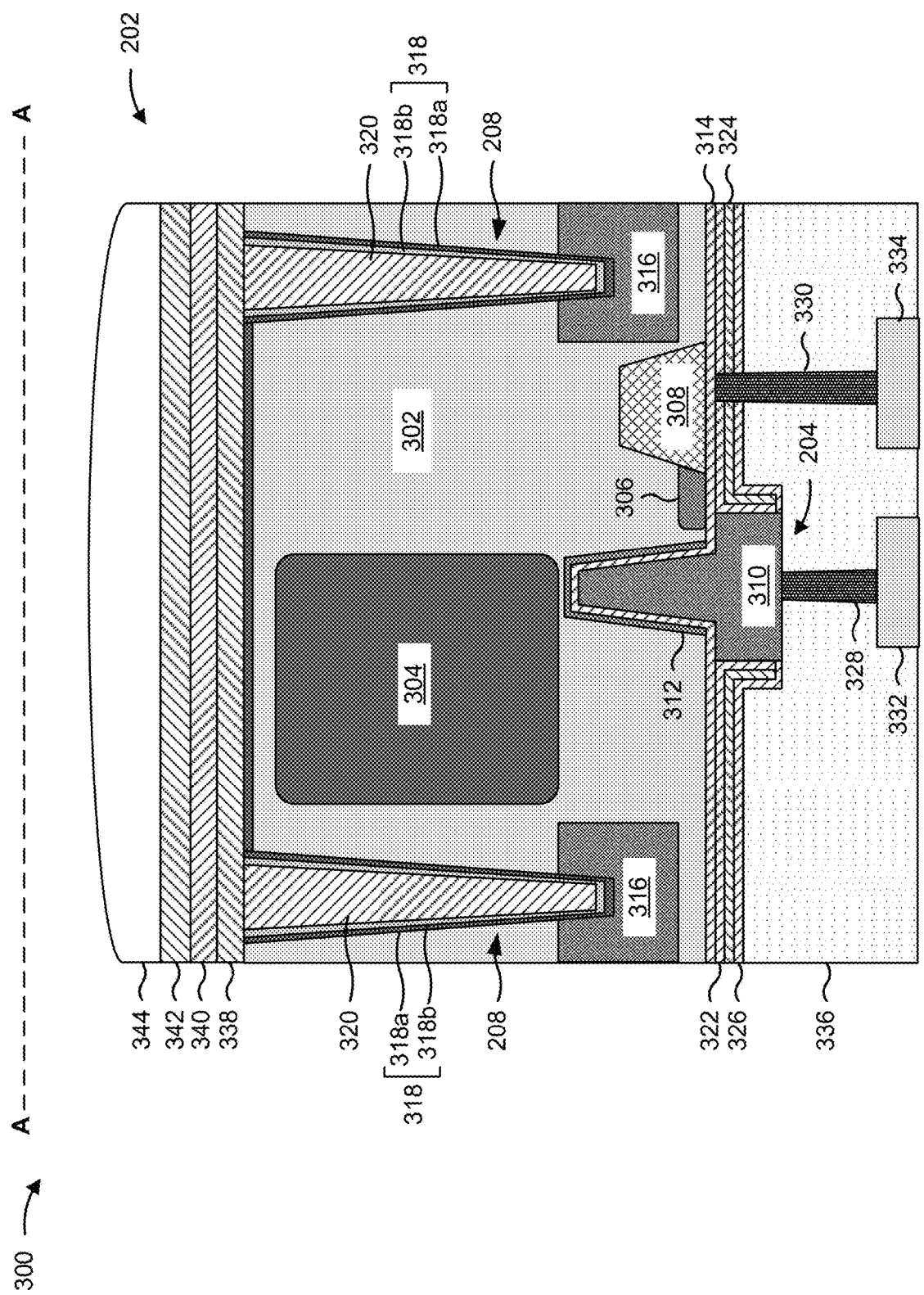
FIGS. 3A and 3B are diagrams of examples of a pixel sensor described herein.
Figure 3B:
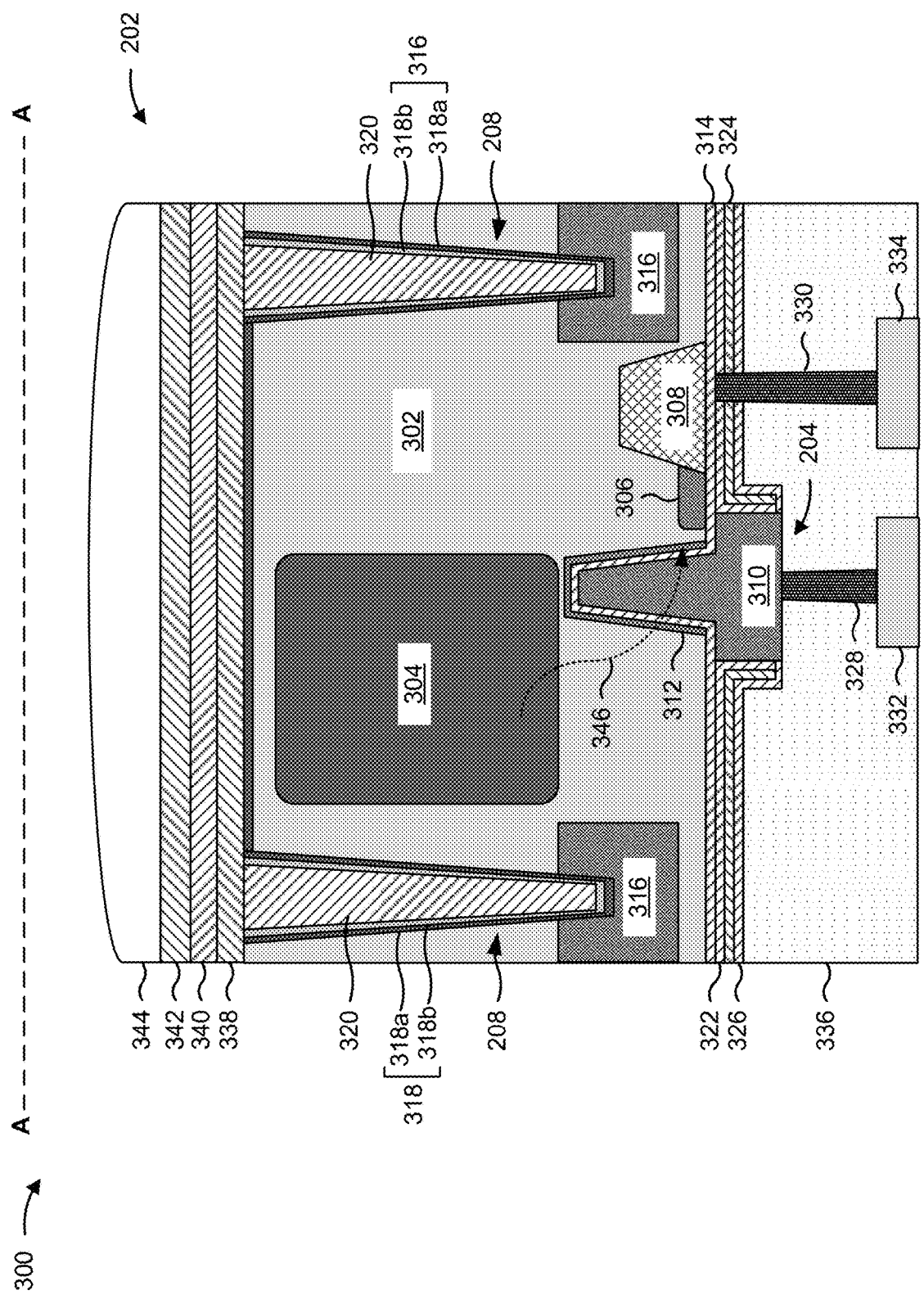

FIGS. 3A and 3B are diagrams of example implementation 300 of a pixel sensor 202 described herein. FIGS. 3A and 3B illustrate the example implementation 300 of the pixel sensor 202 in cross-section views of the pixel sensor 202 along the cross-section A-A of the pixel array 200 in FIGS. 2A and 2B. In some implementations, the pixel sensor 202 may be included in the pixel array 200. In some implementations, the pixel sensor 202 may be included in an image sensor. The image sensor may be a CMOS image sensor, a BSI CMOS image sensor, or another type of image sensor.

As shown in FIG. 3A, the pixel sensor 202 may include a substrate 302. The substrate 302 may include a semiconductor die substrate, a semiconductor wafer, a stacked semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 202 may include a photodiode 304 that is included in the substrate 302. The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions of the photodiode 304, and the substrate 302 may be doped with a p-type dopant to form a p-type region of the photodiode 304. The photodiode 304 may be configured to absorb photons of incident light. The absorption of photons causes the photodiode 304 to accumulate a charge (referred to as a photocurrent) due to the photoelectric effect. Photons may bombard the photodiode 304, which causes emission of electrons in the photodiode 304.

The regions included in the photodiode 304 may be stacked and/or vertically arranged. For example, the p-type region may be included over the one or more n-type regions. The p-type region may provide noise isolation for the one or more n-type regions and may facilitate photocurrent generation in the photodiode 304. In some implementations, the p-type region (and thus, the photodiode 304) is spaced away (e.g., downward) from a surface of the substrate 302 to provide noise isolation and/or light-leakage isolation from one or more metallization layers of the pixel sensor 202. The gap between the surface of the substrate 302 and the p-type region may decrease charging of the pixel sensor 202, may decrease the likelihood of plasma damage to the photodiode 304, and/or may reduce the dark current of the pixel sensor 202 and/or the white pixel performance of the pixel sensor 202, among other examples.

The pixel sensor 202 may include a drain extension region 306 and a drain region 308 coupled and/or electrically connected to the drain extension region 306. The drain extension region 306 may be adjacent to the drain region 308. The drain region 308 may include a highly-doped n-type region (e.g., an $n^+$ doped region). The drain extension region 306 may include lightly-doped n-type region(s) that facilitate the transfer of photocurrent from the photodiode 304 to the drain region 308. In some implementations, the drain extension region 306 is spaced away (e.g., downward) from a surface of the substrate 302 to provide noise isolation and/or light-leakage isolation from one or more metallization layers of the pixel sensor 202. The gap between the surface of the substrate 302 and the drain extension region 306 may increase noise isolation for the drain extension region 306, may decrease random noise and/or random telegraph noise in the pixel sensor 202, may decrease the likelihood of plasma damage to the drain extension region 306, and/or may reduce the dark current of the pixel sensor 202 and/or the white pixel performance of the pixel sensor 202, among other examples.

The pixel sensor 202 may include a vertical transfer gate (VTG) 204 to control the transfer of photocurrent between the photodiode 304 and the drain region 308. The vertical transfer gate 204 may be energized by applying a voltage or a current to a gate electrode 310 of the vertical transfer gate 204 to cause a conductive channel to form between the photodiode 304 and the drain extension region 306. The conductive channel may be removed or closed by de-energizing the gate electrode 310 of the vertical transfer gate 204, which blocks and/or prevents the flow of photocurrent between the photodiode 304 and the drain region 308.

The vertical transfer gate 204 may be located below and/or under the photodiode 304, which may reduce the lateral width of the pixel sensor 202 as opposed to locating the photodiode 304 side-by-side with the vertical transfer gate 204. The vertical transfer gate 204 extends into the substrate 302 from a surface of the substrate 302 and is adjacent to the drain extension region 306 and the drain region 308. The vertical transfer gate 204 extending into the substrate 302 increases the depth of the conductive channel that is controlled by the vertical transfer gate 204. The increased depth of the conductive channel enables the photodiode 304 to be located deeper in the pixel sensor 202 and closer to where light enters the pixel sensor 202. This may increase the sensitivity and efficiency of the pixel sensor 202.

The gate electrode 310 may include polysilicon, doped polysilicon (e.g., n-doped polysilicon), a metal gate stack, and/or another suitable material. The gate electrode 310 may include a gate electrode stack that includes an n-doped upper transfer gate electrode region and a lower transfer gate electrode region.

A passivation layer 312 and a gate dielectric layer 314 may be included between the gate electrode 310 and the substrate 302 of the pixel sensor 202. The passivation layer 312 may be included over and/or on the substrate 302, the gate dielectric layer 314 may be included over and/or on the passivation layer 312, and the gate electrode 310 may be included over and/or on the gate dielectric layer 314. The gate dielectric layer 314 may also extend along a frontside surface of the substrate 302.

The passivation layer 312 may include a boron (B) material, an amorphous boron (a-B) material, and/or another material. The passivation layer 312 may provide a boron-silicon interface between the passivation layer 312 and the substrate 302. The boron-silicon interface resists, reduces, and/or minimizes penetration and/or diffusion of photons and/or electrons into the gate electrode 310 of the vertical transfer gate 204. The gate dielectric layer 314 may include a dielectric material such as tetraethyl orthosilicate (TEOS) or another type of dielectric material.

The pixel sensor 202 may include a plurality of regions to provide electrical isolation and/or optical isolation between the pixel sensor 202 and adjacent pixel sensors. The pixel sensor 202 may include a deep p-well region (DPW) 316 adjacent to, and at least partially surrounding, the photodiode 304. In some implementations, the pixel sensor 202 further includes a cell p-well region (CPW) above the deep p-well region 316. The deep p-well region 316 (and the cell p-well region, if included) may include a circle or ring shape in a top-down view in the substrate 302. The deep p-well region 316 (and the cell p-well region, if included) may each include a $p^+$ doped silicon material or another $p^+$ doped material.

The DTI structure 208 may be included in the substrate 302 adjacent to the photodiode 304 and the drain region 312. Moreover, the DTI structure 208 may be included above and/or partially in the deep p-well region 316. In some implementations, the DTI structure 208 may be included in a cell p-well region. The DTI structure 208 may include one or more trenches that extend downward into the substrate 302 (e.g., from the backside of the substrate 302), and that are that are adjacent the photodiode 304, the drain extension region 306, and the drain region 308. In a top-down view of the pixel sensor 202, the DTI structure 208 may surround the photodiode 304, the drain extension region 306, and the drain region 308. In other words, the photodiode 304, the drain extension region 306, and the drain region 308 may be included within a perimeter of the DTI structure 208 of the pixel sensor 202. The DTI structure 208 may provide optical isolation between the pixel sensor 202 and one or more adjacent pixel sensors to reduce the amount of optical crosstalk between the pixel sensor 202 and the one or more adjacent pixel sensors. In particular, the DTI structure 208 may absorb, refract, and/or reflect photons of incident light, which may reduce the amount of incident light that travels through a pixel sensor 202 into an adjacent pixel sensor and is absorbed by the adjacent pixel sensor.

The DTI structure 208 may include one or more layers 318 between the substrate 302 of the pixel sensor 202 and an oxide layer 320 of the DTI structure 208. The one or more layers 318 may include a passivation layer 318a and a capping layer 318b, among other examples. The passivation layer 318a may be included between the substrate 302 (e.g., the silicon substrate) of the pixel sensor 202 and the capping layer 318b. The capping layer 318b may be included between the passivation layer 318a and the oxide layer 320.

The passivation layer 318a may include a boron (B) material, an amorphous boron (a-B) material, and/or another material. The capping layer 318b may include a silicon (Si) material, an amorphous silicon (a-Si) material, and/or another material. The passivation layer 318a may be included to further decrease optical crosstalk by providing a boron-silicon interface between the passivation layer 318a and the substrate 302. The boron-silicon interface resists, reduces, and/or minimizes penetration and/or diffusion of photons into the sidewall oxide layer 322. The capping layer 318b may be included to protect the passivation layer 318a from damage during one or more semiconductor processing operations for forming the pixel sensor 202. The passivation layer 318a (e.g., an amorphous boron layer) may be included on the back side of the pixel sensor 202 (e.g., on the back side of the substrate), as shown in the example in FIG. 3A.

The oxide layer 320 may function to reflect incident light toward the photodiode 304 to increase the quantum efficiency of the pixel sensor 202 and to reduce optical crosstalk between the pixel sensor 202 and one or more adjacent pixel sensors. In some implementations, the oxide layer 320 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 320.

A sidewall oxide layer 322 may be included over and/or the gate dielectric layer 314 on the frontside surface of the substrate 302. The sidewall oxide layer 322 may also be included on sidewalls of a portion of the gate electrode 310. The sidewall oxide layer 322 may include an oxide such as silicon oxide ($SiO_x$) or another type of oxide material. A remote plasma oxide (RPO) layer 324 may be included over and/or on the sidewall oxide layer 322 over the frontside surface of the substrate 302. The remote plasma oxide layer 324 may also be included over the sidewall oxide layer 322 on the sidewalls of the portion of the gate electrode 310. A contact etch stop layer (CESL) 326 may be included over and/or on the remote plasma oxide layer 324 over the frontside surface of the substrate 302.

The vertical transfer gate 204 and the drain region 308 may be electrically connected to interconnects 328 and 330, respectively, with respective metallization layers 332 and 334 above the substrate 302. The interconnects 328 and 330, and the metallization layers 332 and 334, may be included in one or more dielectric layers 336. The interconnect 328 may be electrically connected with gate electrode 310 of the vertical transfer gate 204. In some implementations, the dielectric layer(s) 336 surround and/or encapsulate the interconnects 328 and 330, as well as the metallization layers 332 and 334. The dielectric layer(s) 336 may include an inter-metal dielectric (AVID) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The interconnects 328 and 330, as well as the metallization layers 332 and 334, may include one or more conductive materials, such as tungsten (W), cobalt (Co), ruthenium (Ru), copper (Cu), and/or another type of conductive material.

As further shown in FIG. 3A, the pixel sensor 202 may include one or more layers on the back side or a bottom side of the substrate 302. On the substrate 302 (e.g., on the bottom of the substrate 302), a $p^+$ ion layer 338 may be included to increase photon-electron conversion. An antireflective coating (ARC) layer 340 may be included above and/or on the $p^+$ ion layer 338. The ARC 340 may include a suitable material for reducing a reflection of incident light projected toward the photodiode 304. For example, the ARC 340 may include nitrogen-containing material.

A color filter layer 342 may be included above and/or on the ARC 340. In some implementations, the color filter layer 342 includes a visible light color filter configured to filter a particular wavelength or a particular wavelength range of visible light (e.g., red light, blue light, or green light). In some implementations, the color filter layer 342 includes a near infrared (NIR) filter (e.g., an MR bandpass filter) configured to permit wavelengths associated with MR light to pass through the color filter layer 342 and to block other wavelengths of light. In some implementations, the color filter layer 342 includes an MR cut filter configured to block MR light from passing through the color filter layer 342. In some implementations, the color filter layer 342 is omitted from the pixel sensor 202 to permit all wavelengths of light to pass through to the photodiode 304. In these examples, the pixel sensor 202 may be configured as a white pixel sensor.

A micro-lens layer 344 may be included above and/or on the color filter layer 342. The micro-lens layer 344 may include a micro-lens for the pixel sensor 202 configured to focus incident light toward the photodiode 304 and/or to reduce optical crosstalk between the pixel sensor 202 and one or more adjacent pixel sensors.

As shown in FIG. 3B, in operation of the pixel sensor 202, a photocurrent 346 is generated by photons of incident light absorbed in the photodiode 304. A current (or voltage) may be applied to the gate electrode 310 of the vertical transfer gate 204 from the metallization layer 332 through an interconnect 328. The current (or voltage) may energize the vertical transfer gate 204, which causes an electric field to form a conductive channel in the substrate 302 between the photodiode 304 and the drain extension region 306. The photocurrent 346 may traverse along the conductive channel from the photodiode 304 to the drain extension region 306. The photocurrent 346 may traverse from the drain extension region 306 to the drain region 308. The photocurrent 346 may be measured through the interconnect 330 at the metallization layer 334.

As indicated above, FIGS. 3A and 3B are provided as examples. Other examples may differ from what is described with regard to FIGS. 3A and 3B.

FIGS. 4A-4D are diagrams of example implementations 400 of a vertical transfer gate 204 of a pixel sensor 202 described herein.

Figure 4A:
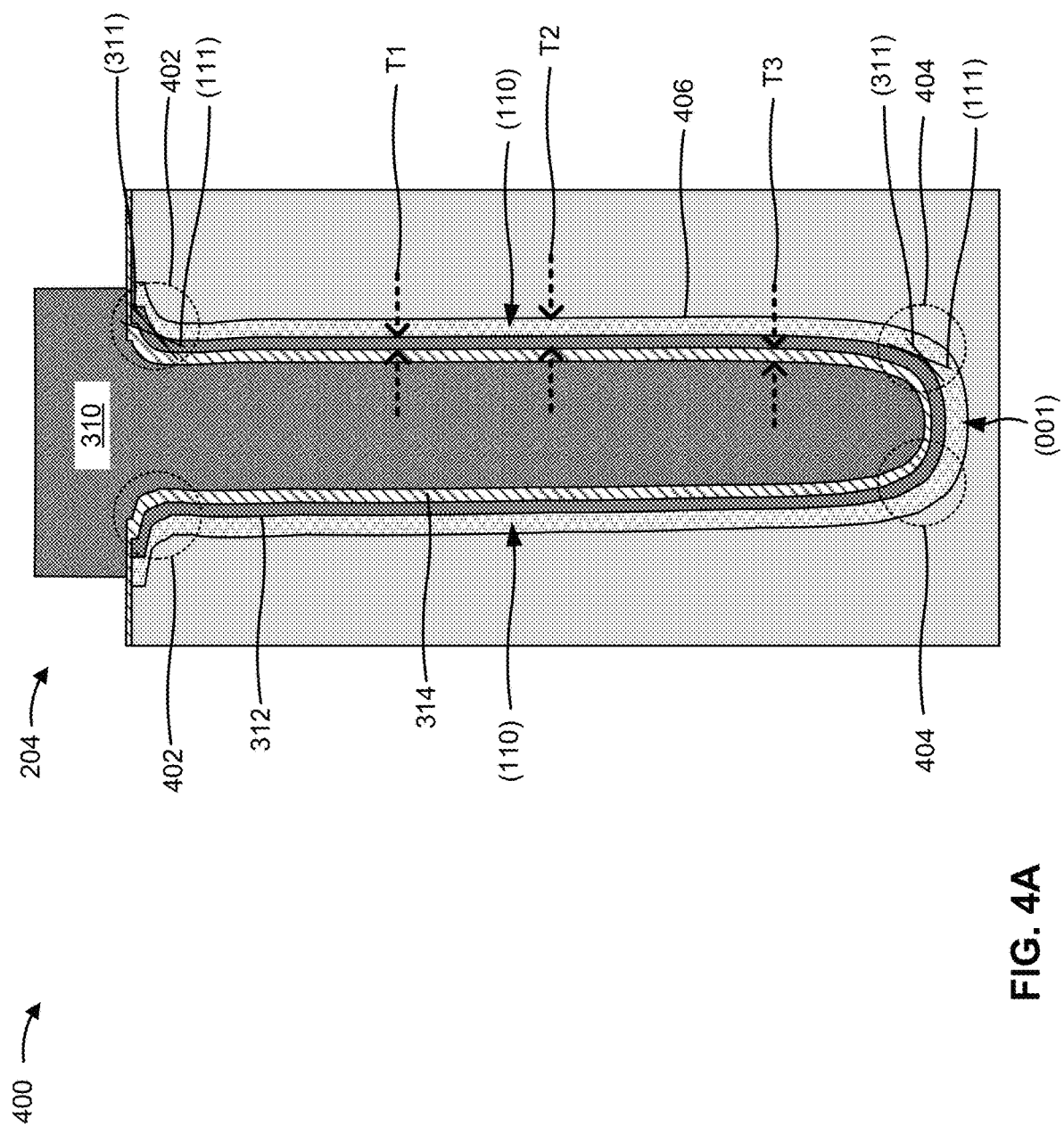
FIGS. 4A-4D are diagrams of examples of a pixel sensor described herein.

As shown in FIG. 4A, the vertical transfer gate 204 includes an elongated structure that extends into the substrate 302. The vertical transfer gate 204 may include rounded top corners 402 at a top of the vertical transfer gate 204, and rounded bottom corners 404 at a bottom of the vertical transfer gate 204. The rounded bottom corners 404 are included in a transition between sidewalls of the vertical transfer gate 204 and a bottom surface of the vertical transfer gate 204. The rounded top corners 402 and/or the rounded bottom corners 404 may be rounded in a manner that increases the breakdown voltage ($V_{BD}$) of the vertical transfer gate 204. For example, the rounded top corners 402 and/or the rounded bottom corners 404 may have a radius of curvature that is included in a range of approximately 10 nanometers to approximately 30 nanometers to increase the breakdown voltage ($V_{BD}$) of the vertical transfer gate 204. Moreover, forming the vertical transfer gate 204 such that the rounded top corners 402 and/or the rounded bottom corners 404 have a radius of curvature that is included in this range may reduce the dark current of the pixel sensor 202 and/or may increase white pixel performance for the pixel sensor 202. However, other values for the range are within the scope of the present disclosure.

The vertical transfer gate 204 may be formed such that the sidewalls, the bottom surface, the rounded top corners 402, and/or the rounded bottom corners 404 have a particular combination of facets or grain orientations. For example, the vertical transfer gate 204 may be formed such that the sidewalls of the vertical transfer gate 204 have a (110) facet or grain orientation. As another example, the vertical transfer gate 204 may be formed such that the bottom surface of the vertical transfer gate 204 has a (001) facet or grain orientation. As another example, the vertical transfer gate 204 may be formed such that the rounded top corners 402 and/or the rounded bottom corners 404 have a combination of facets or grain orientations, including a (311) facet or grain orientation and a (111) facet or grain orientation. This particular combination of facets or grain orientations may reduce surface roughness in the rounded top corners 402 and/or the rounded bottom corners 404 (e.g., to approximately 1 nanometer surface roughness or less), which may reduce gate leakage for the vertical transfer gate 204, may reduce the dark current of the pixel sensor 202, and/or may increase white pixel performance for the pixel sensor 202. However, other combinations of facets or grain orientations are within the scope of the present disclosure.

As further shown in FIG. 4A, the passivation layer 312 may have a thickness (T1). In some implementations, the thickness (T1) of the passivation layer 312 may be included in a range of approximately 5 nanometers to approximately 15 nanometers to reduce the diffusion length (T2—also referred to as La) of the passivation layer 312, to provide sufficient boron (B) to form a continuous boron layer for the passivation layer 312, and to provide gap-filling performance for the gate electrode 310. However, other values for the range are within the scope of the present disclosure.

The diffusion length (T2) of the passivation layer 312 refers to the distance between the top surface of the passivation layer and the end of a diffusion region 406 in the substrate 302. The diffusion region 406 refers to a region in the substrate 302 around the vertical transfer gate 204 in which boron from the passivation layer 312 diffuses into the silicon of the substrate 302. Thus, the diffusion region 406 may include boron-doped silicon (Si:B). The "end" of the diffusion region 406 may correspond to a depth in the substrate 302 at which the boron concentration is approximately $1 \times 10^{16}$ atoms per cubic centimeter. The diffusion of boron from the passivation layer 312 into the silicon of the substrate 302 may occur during front end processing of the pixel sensor 202, and in particular due to the thermal budget of the front end processing of the pixel sensor 202. As described herein, the techniques that are used to form the passivation layer 312 may reduce the diffusion length (T2) of the passivation layer 312, may increase the uniformity of the passivation layer 312 along the sidewalls and bottom surface of the vertical transfer gate 204, and/or may increase the uniformity of depth and boron concentration in the diffusion region 406 along the sidewalls and bottom surface of the vertical transfer gate 204. In some implementations, the passivation layer 312 is doped with carbon (C) to further resist boron diffusion into the substrate 302 during front end processing of the pixel sensor 202.

In some implementations, the diffusion length (T2) of the passivation layer 312 may be included in a range of approximately 70 nanometers to approximately 80 nanometers to provide sufficient protection against photon and electron diffusion into the vertical transfer gate 204 while providing sufficient area in the substrate 302 for the photodiode 304. However, other values for the range are within the scope of the present disclosure. In some implementations, the diffusion length (T2) of the passivation layer 312 is less than the width or critical dimension (CD) of the vertical transfer gate 204, which may be approximately 80 nanometers to approximately 100 nanometers, among other examples. In some implementations, a thickness (T3) of the gate dielectric layer 314 is included in a range of approximately 65 angstroms to approximately 75 angstroms. However, other values for the range are within the scope of the present disclosure.

Figure 4B:
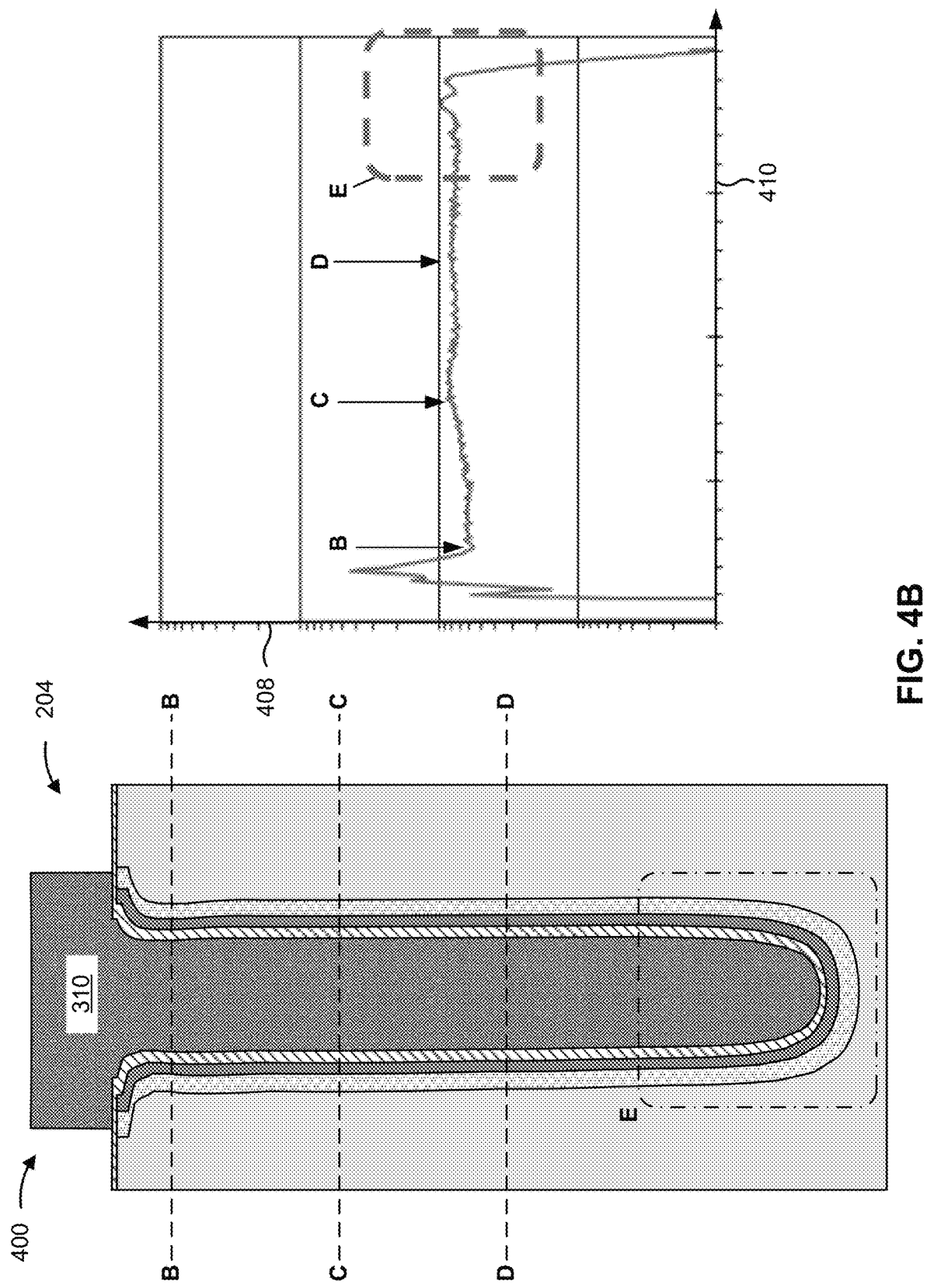

FIG. 4B illustrates an example of the boron concentration uniformity of the passivation layer 312 along the sidewalls and the bottom surface of the vertical transfer gate 204. In particular, the concentration 408 of boron in the passivation layer 312 is illustrated as a function of depth 410 in the vertical transfer gate 204. As shown in FIG. 4B, the concentration 408 of boron in the passivation layer 312 is approximately uniform along the sidewalls of the vertical transfer gate 204, as illustrated a depths B-B, C-C, and D-D in the vertical transfer gate 204. Moreover, the uniformity of concentration 408 of boron in the passivation layer 312 continues into the bottom region E of the vertical transfer gate 204, as illustrated in the example in FIG. 4B. In particular, the concentration 408 of boron in the passivation layer 312 in the bottom region E is approximately equal to the concentration 408 of boron in the passivation layer 312 along the sidewalls of the vertical transfer gate 204. In some implementations, the concentration 408 of the boron in the passivation layer 312 along the sidewalls and bottom surface of the vertical transfer gate 204 may be included in a range of approximately $3 \times 10^{17}$ atoms per cubic centimeter to approximately $6 \times 10^{18}$ atoms per cubic centimeter to achieve sufficient passivation of the vertical transfer gate 204 without unduly increasing the threshold voltage ($V_t$) of the vertical transfer gate 204. However, other values for the range are within the scope of the present disclosure.

Figure 4C:
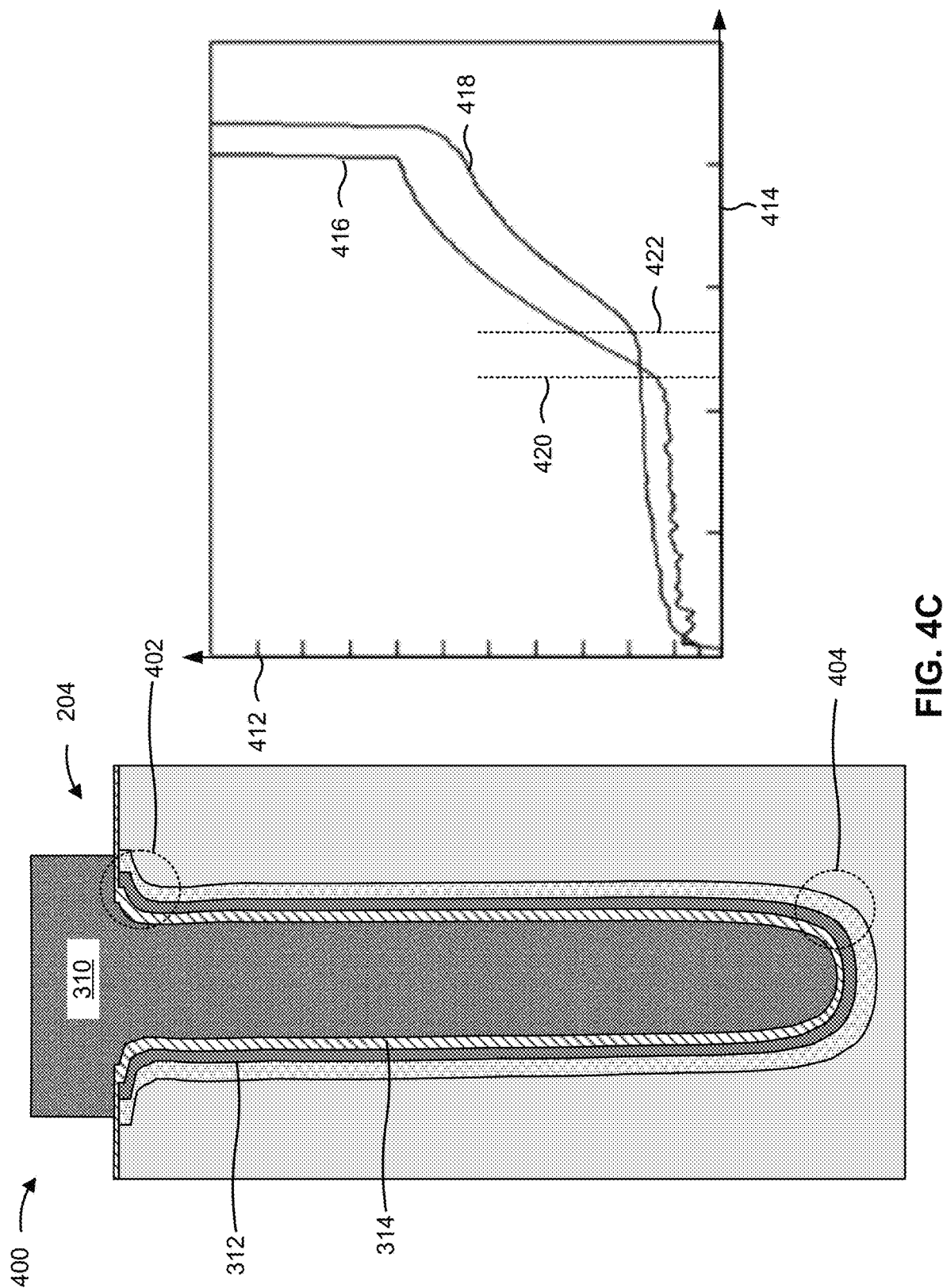

FIG. 4C illustrates an example of breakdown voltage ($V_{BD}$) for the vertical transfer gate 204. The breakdown voltage is illustrated as a function of current 412 and voltage 414. A plotline 416 corresponds to a vertical transfer gate having sharp or non-rounded corners, whereas a plotline 418 corresponds to the vertical transfer gate 204 having the rounded top corners 402 and/or the rounded bottom corners 404. As shown in FIG. 4C, a breakdown voltage 420 for the vertical transfer gate having sharp or non-rounded corners may be lesser relative to a breakdown voltage 422 of the vertical transfer gate 204 having the rounded top corners 402 and/or the rounded bottom corners 404.

Figure 4D:
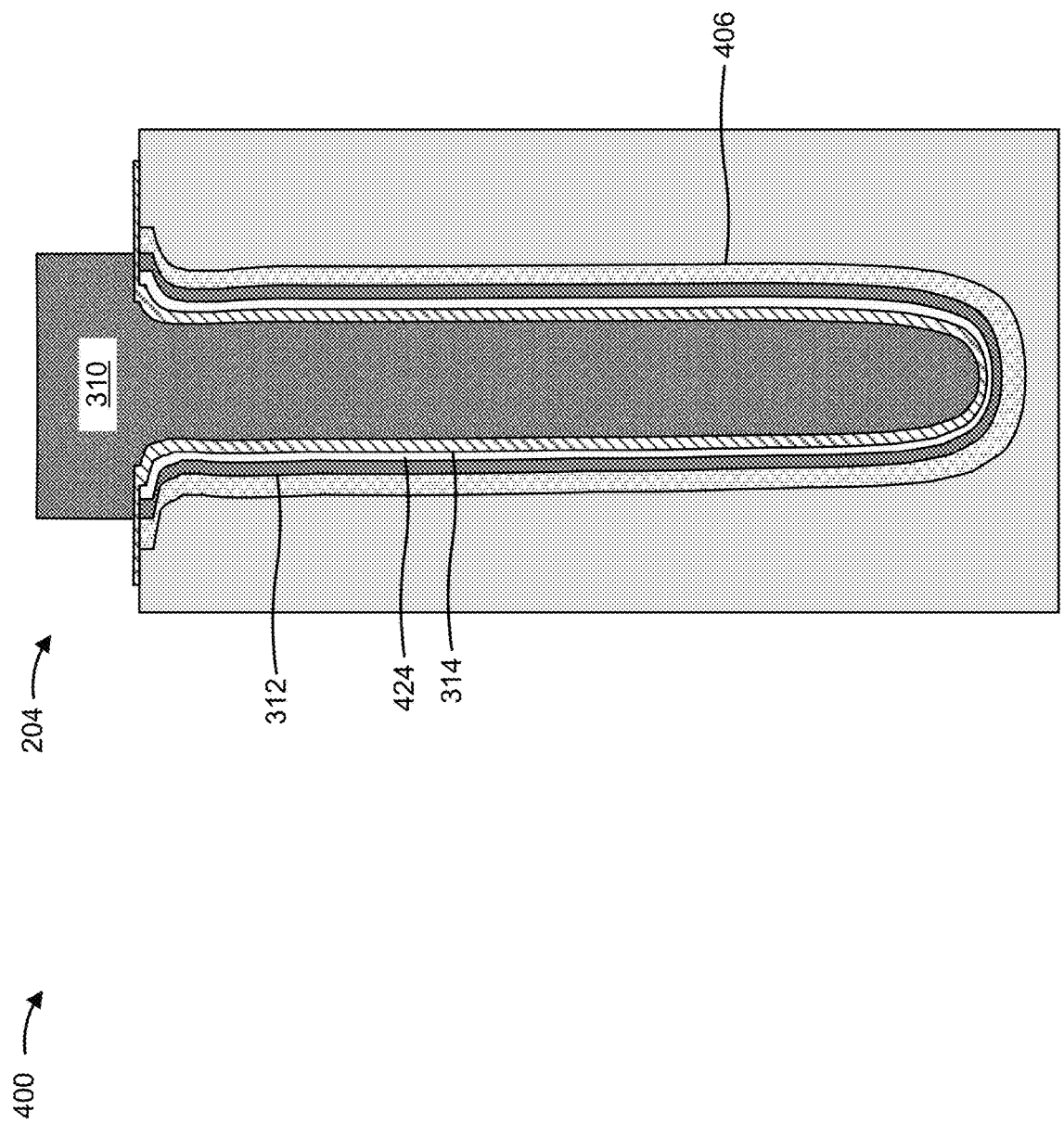

FIG. 4D illustrates an example in which the vertical transfer gate 204 includes a capping layer 424. The capping layer 424 may be included between the passivation layer 312 and the gate dielectric layer 314. The capping layer 424 may include a silicon (Si) material, an amorphous silicon (a-Si) material, and/or another material. The capping layer 424 may be included to protect the passivation layer 312 from damage during one or more semiconductor processing operations for forming the pixel sensor 202.

As indicated above, FIGS. 4A-4D are provided as examples. Other examples may differ from what is described with regard to FIGS. 4A-4D.

Figure 5A:
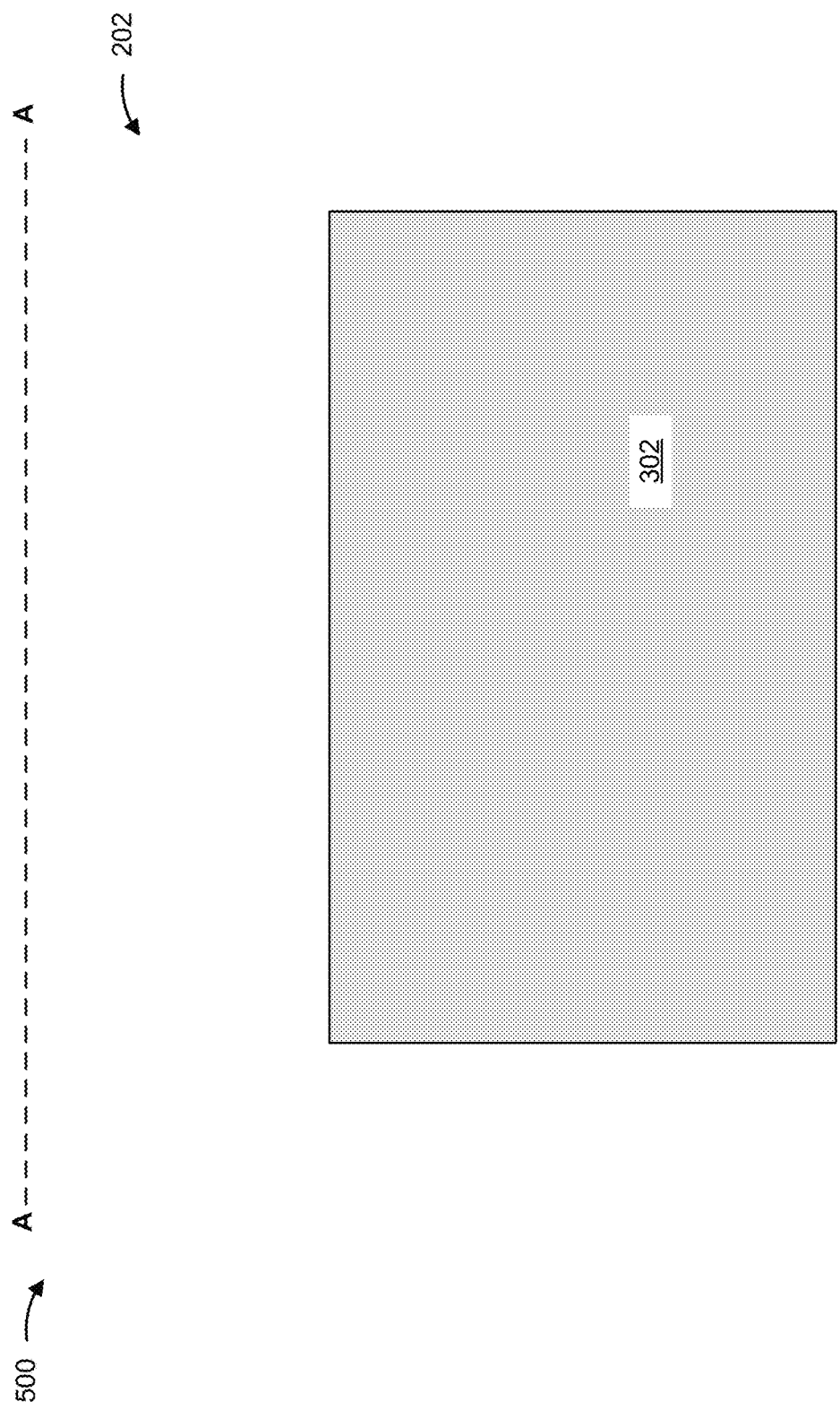
FIGS. 5A-5D are diagrams of an example implementation described herein.

FIGS. 5A-5D are diagrams of an example implementation 500 described herein. Example implementation 500 may be an example process for forming a pixel sensor 202 described herein, such as the pixel sensor 202 described in connection with FIGS. 3A and 3B. One or more of FIGS. 5A-5D are illustrated along the cross-section A-A of the pixel array 200 in FIGS. 2A and 2B. As shown in FIG. 5A, the example process for forming the pixel sensor 202 may be performed in connection with the substrate 302.

Figure 5B:
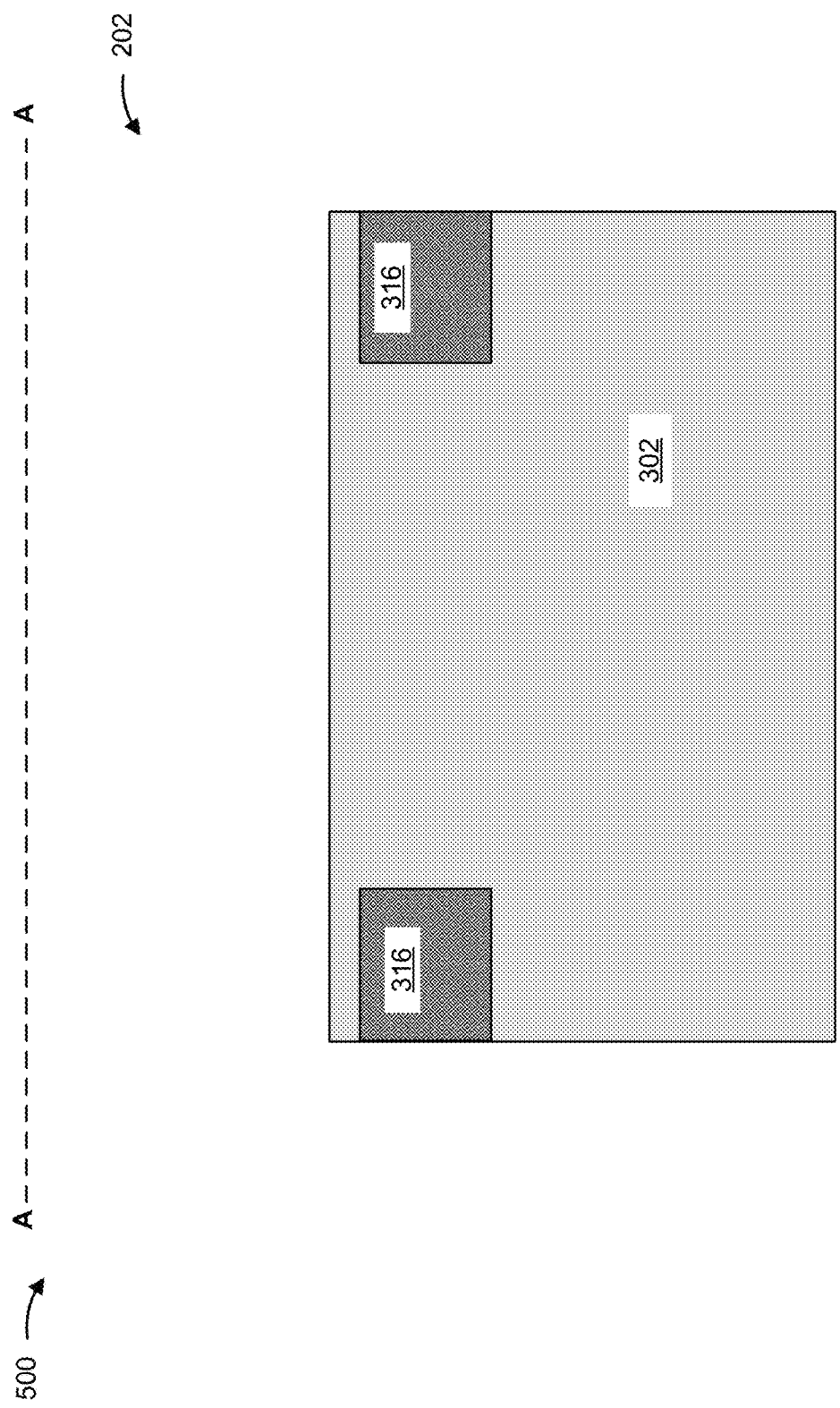

As shown in FIG. 5B, the deep p-well region (DPW) 316 may be formed in the substrate 302. For example, the deep p-well region 316 may be formed (e.g., as a circle or ring shape in a top-down view) in the substrate 302 to provide electrical isolation and/or optical isolation for the pixel sensor 202. In some implementations, the ion implantation tool 114 dopes the substrate 302 by ion implantation to form the deep p-well region 316. For example, the ion implantation tool 114 may implant $p^+$ ions into a first region of the substrate 302 to form the deep p-well region 316. In some implementations, the ion implantation tool 114 dopes a portion of the substrate 302 above the deep p-well region 316 with $p^+$ ions to form a cell p-well region (CPW) above and/or over the deep p-well region 316. In some implementations, the substrate 302 may be doped using another doping technique such as diffusion to form the deep p-well region 316.

Figure 5C:
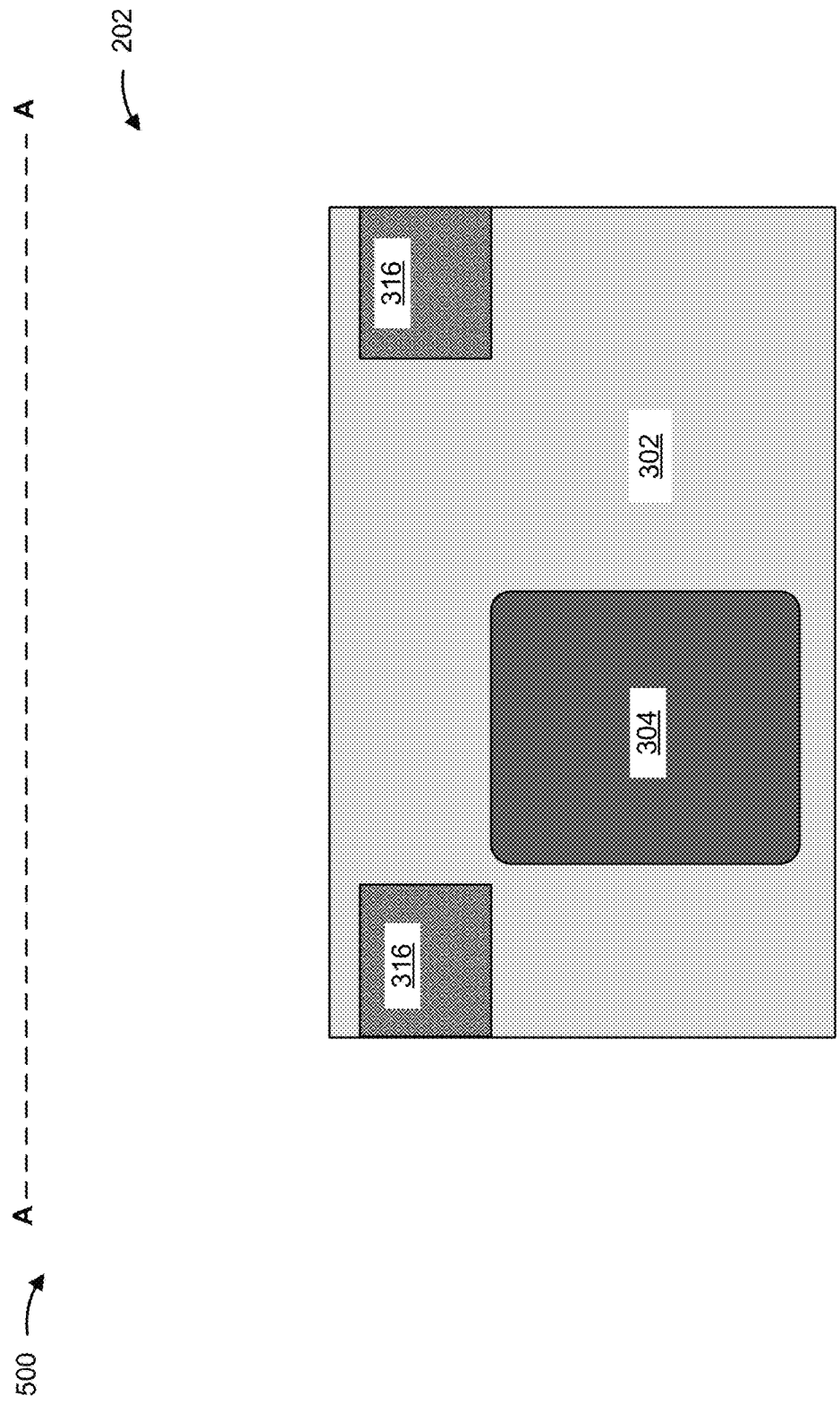

As shown in FIG. 5C, the substrate 302 may be doped to form the photodiode 304. In some implementations, the ion implantation tool 114 dopes a plurality of regions of the substrate 302 with different types of dopants and/or with different concentrations of dopants. For example, the ion implantation tool 114 may implant $p^+$ ions in the substrate 302 to form a p-type region and/or may implant $n^+$ ions in the substrate to form a n-type region to form the photodiode 304. The ion implantation tool 114 may form the n-type region and/or the p-type region within the perimeter of the deep p-well region 316. In some implementations, the plurality of regions of the substrate 302 may be doped using another doping technique such as diffusion to form the photodiode 304.

Figure 5D:
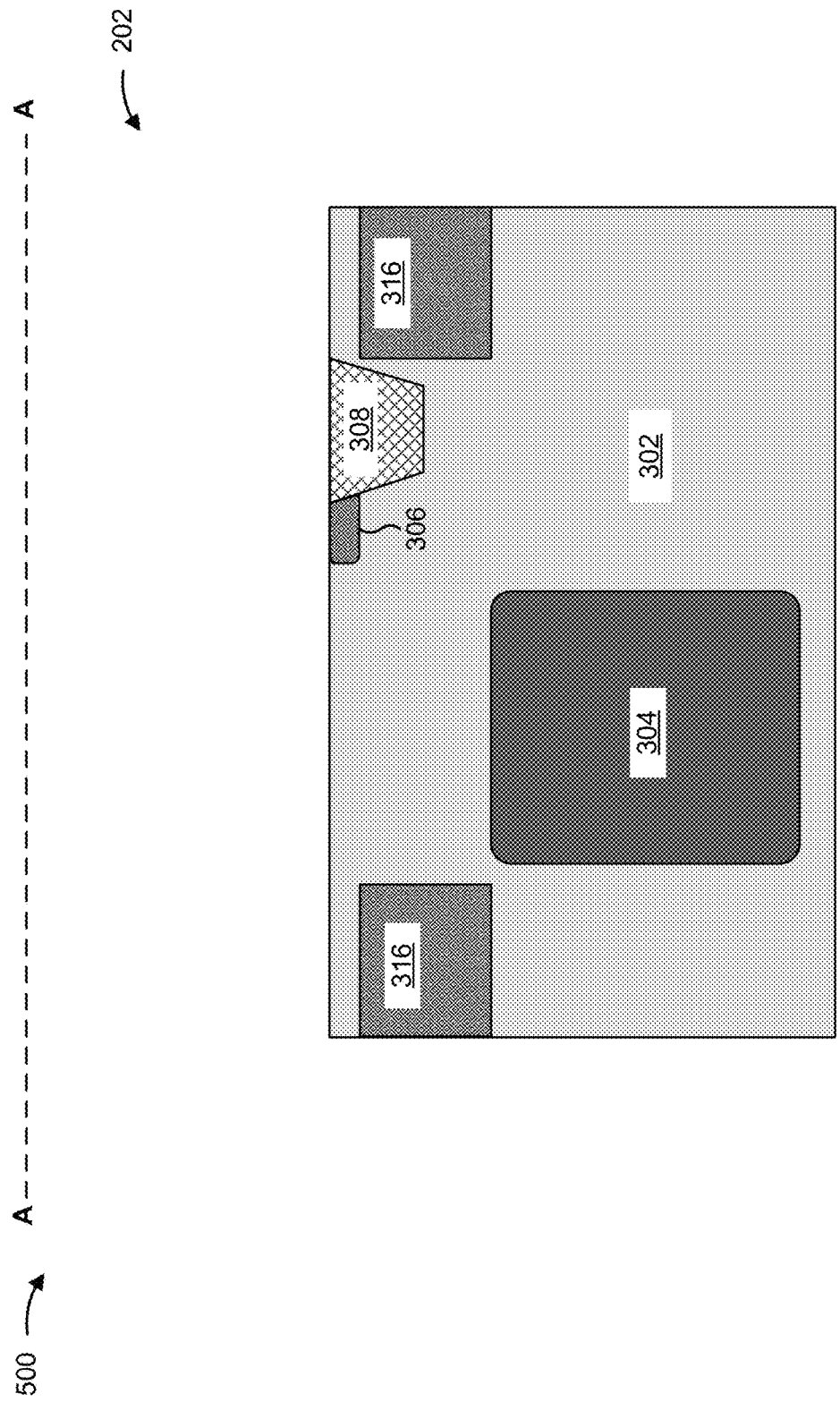

As shown in FIG. 5D, a plurality of regions of the substrate 302 may be doped to form the drain extension region 306 and the drain region 308. In some implementations, the ion implantation tool 114 dopes the plurality of regions of the substrate 302 by one or more ion implantation operations. For example, the ion implantation tool 114 may implant n⁺ ions in the substrate 302 to form the drain region 308, and may implant n⁺ ions in the substrate 302 adjacent to the drain region 308 to form the drain extension region 306. The ion implantation tool 114 may form the drain region 308 and the drain extension region 306 within the perimeter of the deep p-well region 316. In some implementations, the plurality of regions of the substrate 302 may be doped using another doping technique such as diffusion to form the drain region 308 and/or the drain extension region 306. In some implementations, the drain extension region 306 and the drain region 308 may be doped with different n-type dopant concentrations.

As indicated above, FIGS. 5A-5D are provided as an example. Other examples may differ from what is described with regard to FIGS. 5A-5D.

FIGS. 6A-6M are diagrams of an example implementation 600 described herein. Example implementation 600 may be an example process for forming a pixel sensor 202 described herein, such as the pixel sensor 202 described in connection with FIGS. 3A and 3B. One or more of FIGS. 6A-6M are illustrated along the cross-section A-A of the pixel array 200 in FIGS. 2A and 2B. In some implementations, the operations described in connection with FIGS. 6A-6M may be performed after one or more of the operations described in connection with FIGS. 5A-5D.

Figure 6A:
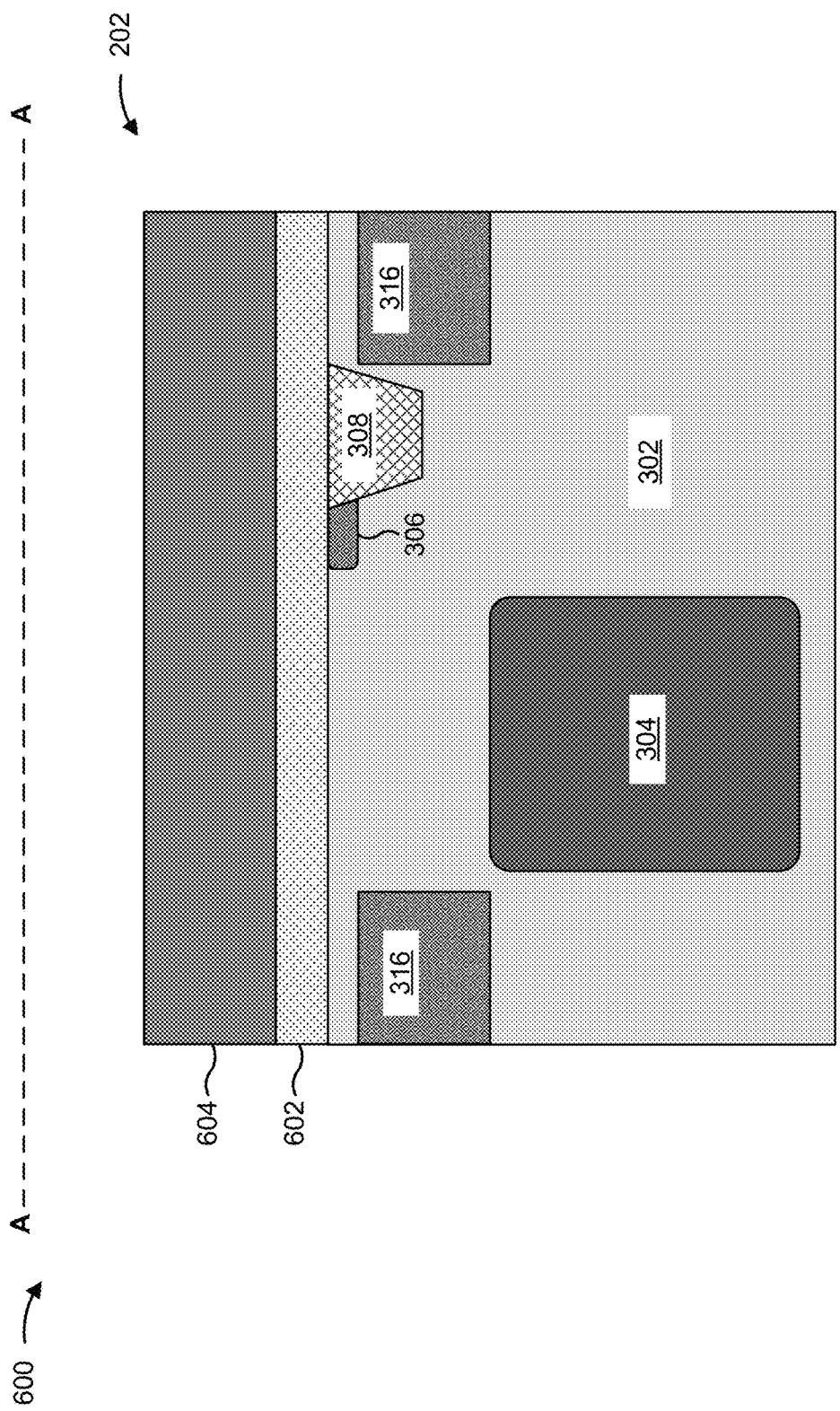

As shown in FIG. 6A, one or more patterning layers may be formed over and/or on the frontside surface of the substrate 302. The one or more pattern layers may include one or more hard mask layers 602 and a photoresist layer 604, among other examples. The deposition tool 102 may form the one or more hard mask layers 602 over and/or on the frontside surface of the substrate 302, and may form the photoresist layer 604 over and/or on the one or more hard mask layers 602. In some implementations, the deposition tool 102 may form the one or more patterning layers using a spin-coating technique, a CVD technique, a PVD technique, an ALD technique, and/or another deposition technique. The one or more hard mask layers 602 may include a silicon nitride ($Si_xN_y$) layer, an oxide layer, and/or another type of hard mask layer.

Figure 6B:
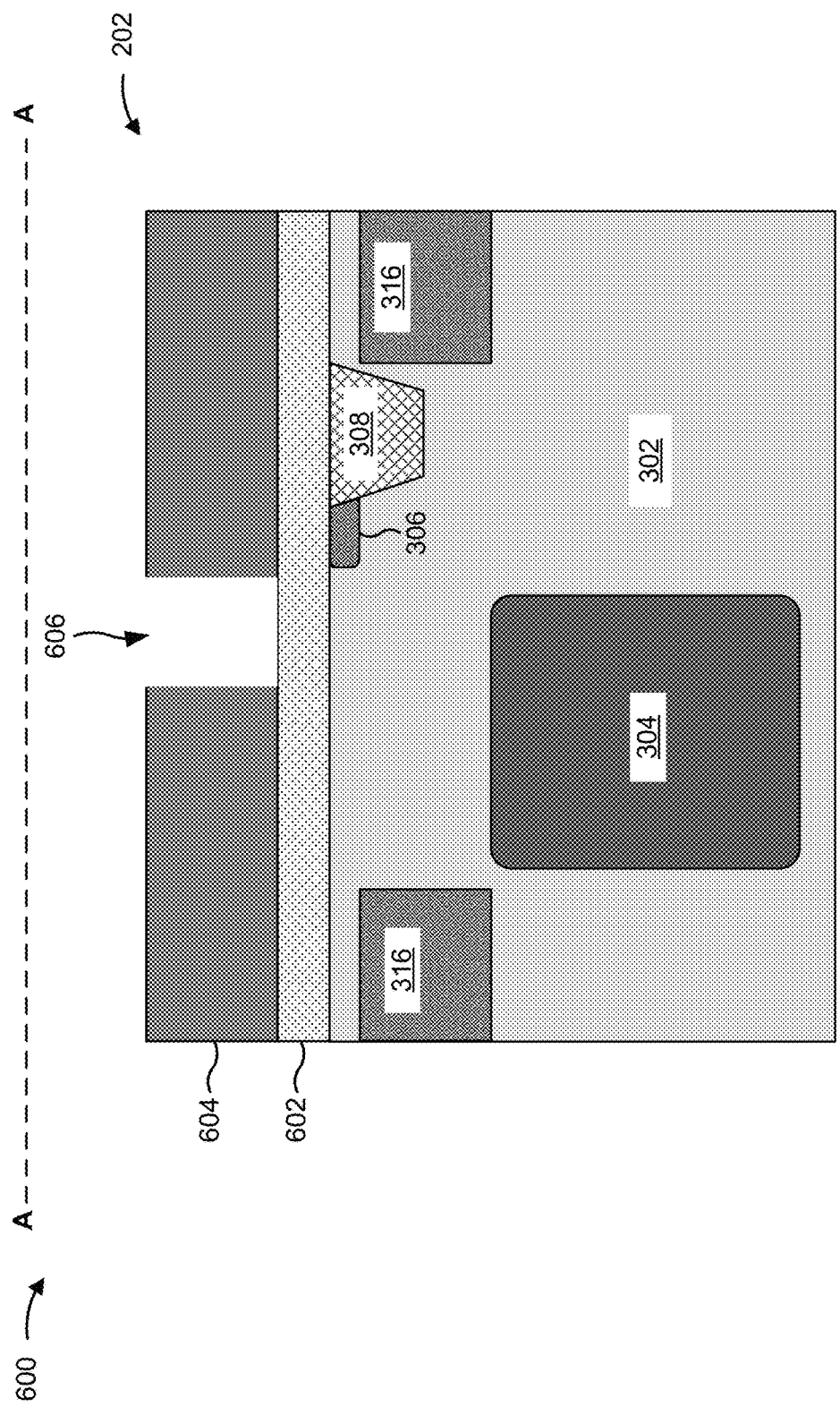

As shown in FIG. 6B, the exposure tool 104 may expose the photoresist layer 604 to a radiation source to form a pattern 606 the photoresist layer 604. The developer tool 106 may develop and remove portions of the photoresist layer 604 to expose the pattern 606.

Figure 6C:
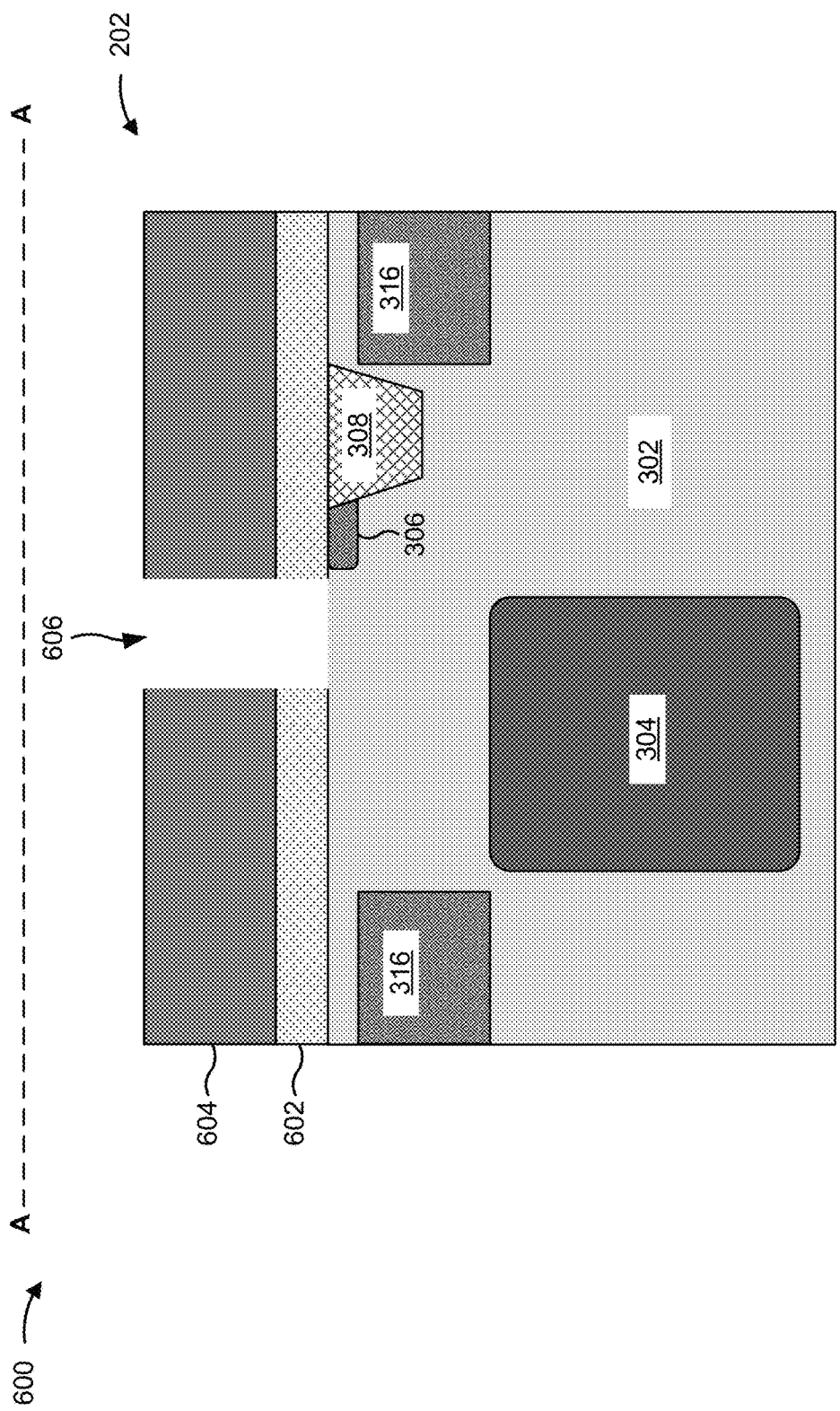

As shown in FIG. 6C, the etch tool 108 may etch a portion of the one or more hard mask layers 602 to extend the pattern 606 into the one or more hard mask layers 602. The etch tool 108 may use a wet etch technique, a dry etch technique, a plasma-enhanced etch technique, and/or another type of etch technique to etch the portion of the one or more hard mask layers 602.

Figure 6D:
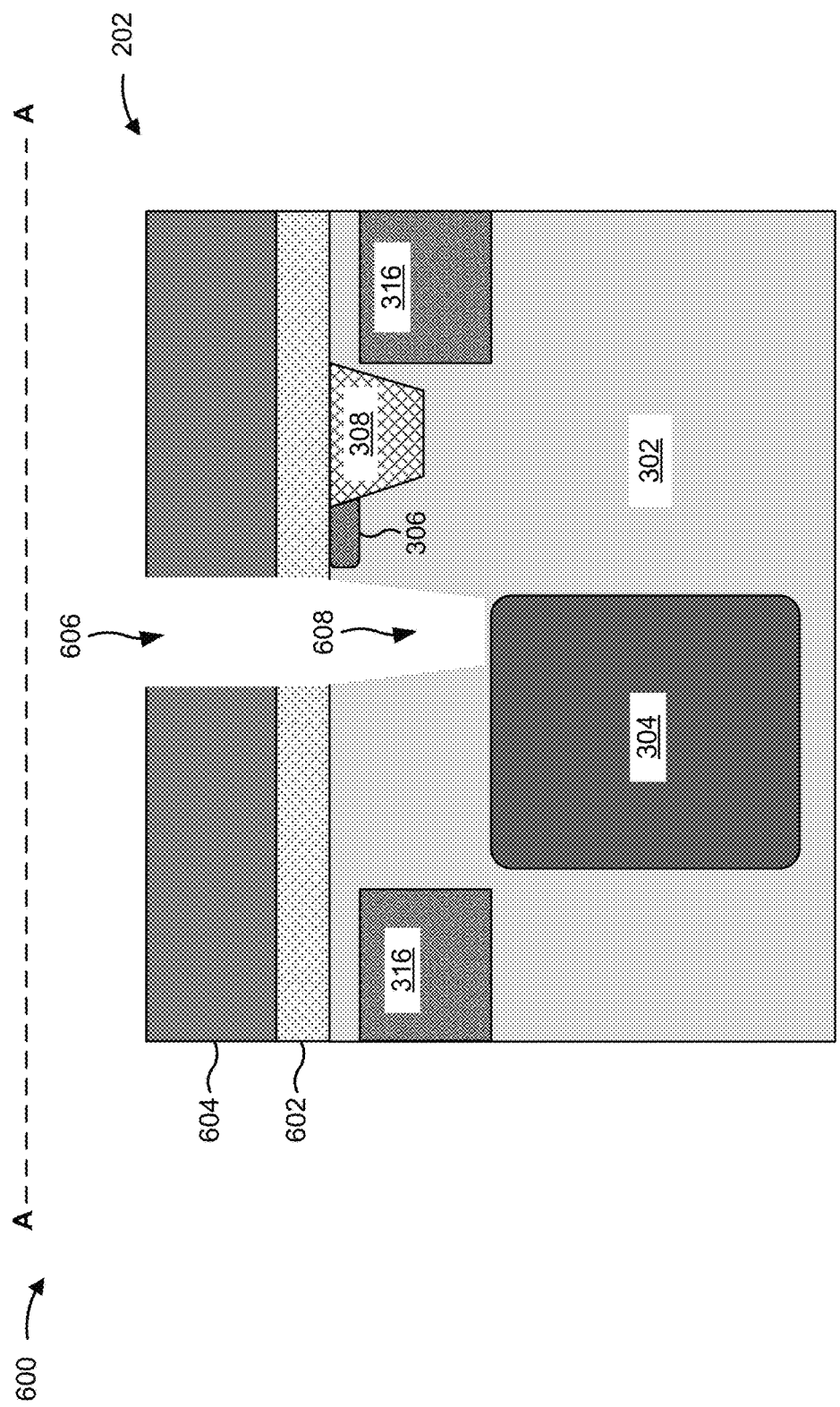

As shown in FIG. 6D, the etch tool 108 may etch into a portion of the substrate 302 from the frontside surface of the substrate 302 to form a recess 608 in the substrate 302. The etch tool 108 may use a wet etch technique, a dry etch technique, a plasma-enhanced etch technique, and/or another type of etch technique to etch the portion of the substrate 302 to form the recess 608 adjacent to (or side-by-side with) the drain extension region 306 and the drain region 308. The etch tool 108 may also form the recess 608 over a portion of the photodiode 304, as shown in the example in FIG. 6D. The recess 608 may be cylindrical shaped, may be trench-shaped, and/or may be formed to another shape.

Figure 6E:
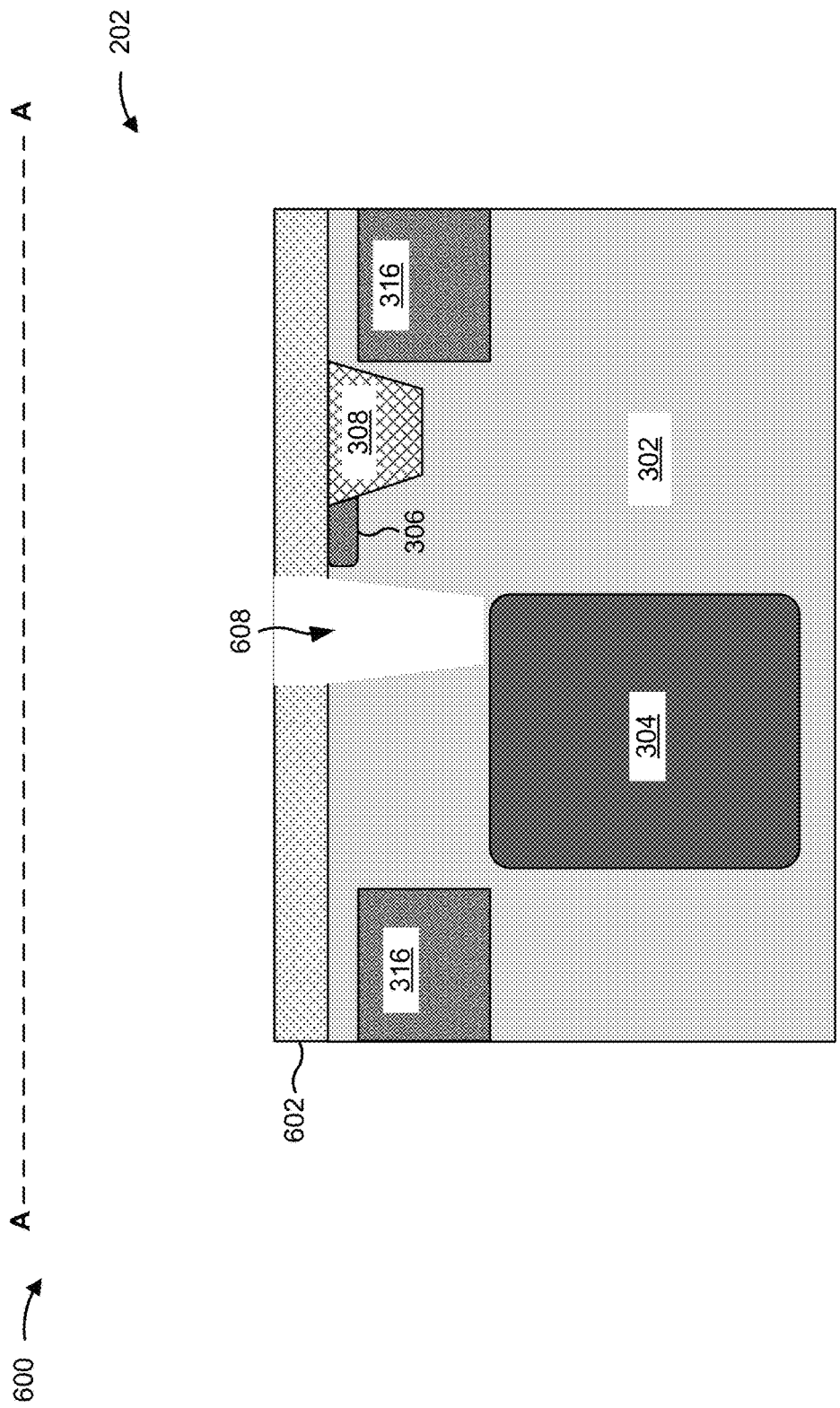

As shown in FIG. 6E, a photoresist removal tool may remove the remaining portions of the photoresist layer 604 (e.g., using a chemical stripper, a plasma asher, and/or another technique) after the etch tool 108 etches the substrate 302 to form the recess 608.

As shown in FIG. 6F, the recess 608 includes sidewalls and a bottom surface. The recess 608 also includes top corners 402 that transition between the sidewalls and the frontside surface of the substrate 302. The recess 608 also includes bottom corners 404 that transition between the sidewalls and the bottom surface.

As further shown in FIG. 6F, the recess 608 may be formed to one or more dimensions. In some implementations, the recess 608 is formed to a height H1 that is included in a range of approximately 400 nanometers to approximately 500 nanometers. However, other values for the range are within the scope of the present disclosure. In some implementations, the recess 608 is formed to a width W1 that is included in a range of approximately 80 nanometers to approximately 100 nanometers. However, other values for the range are within the scope of the present disclosure.

Figure 6G:
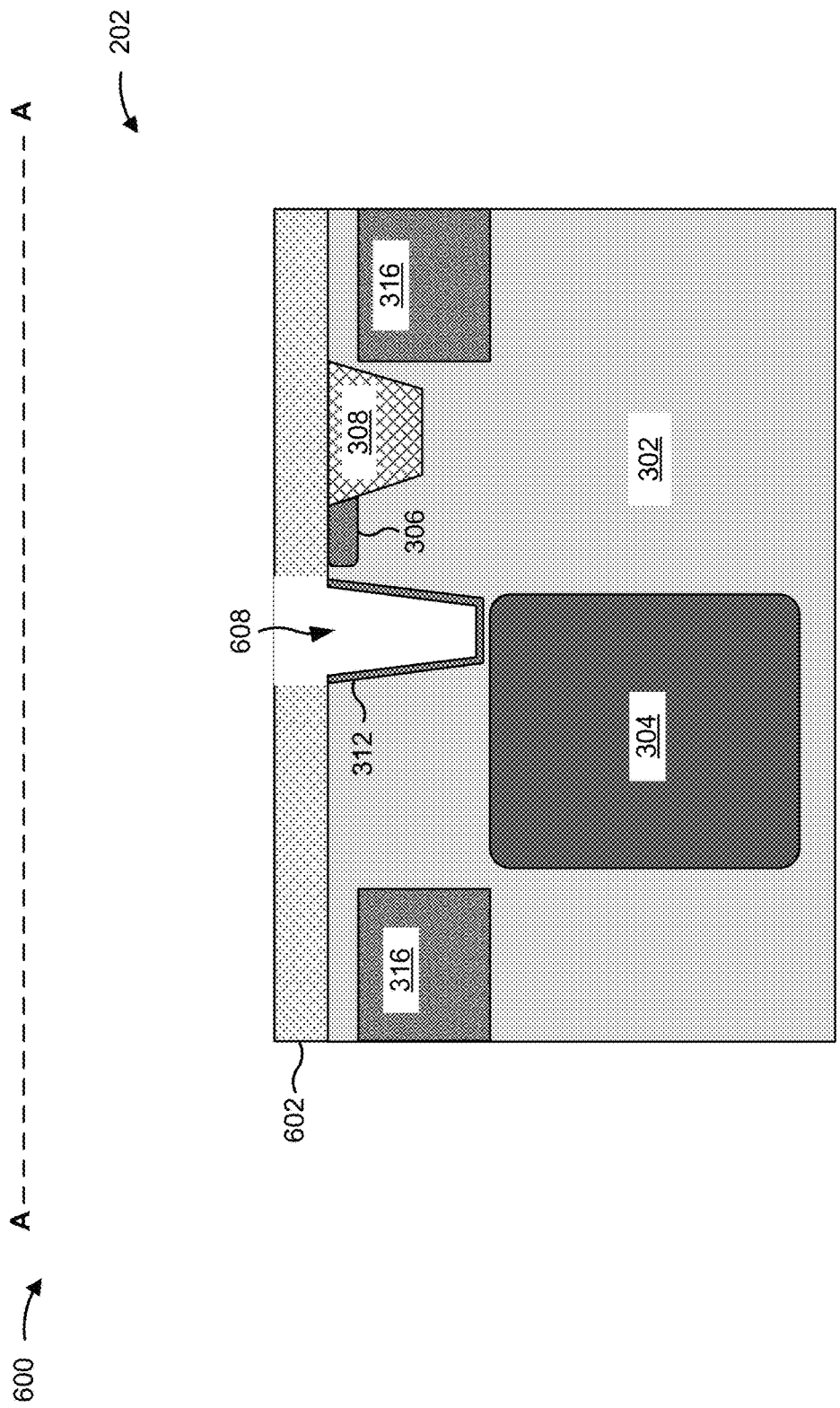
Figure 6H:
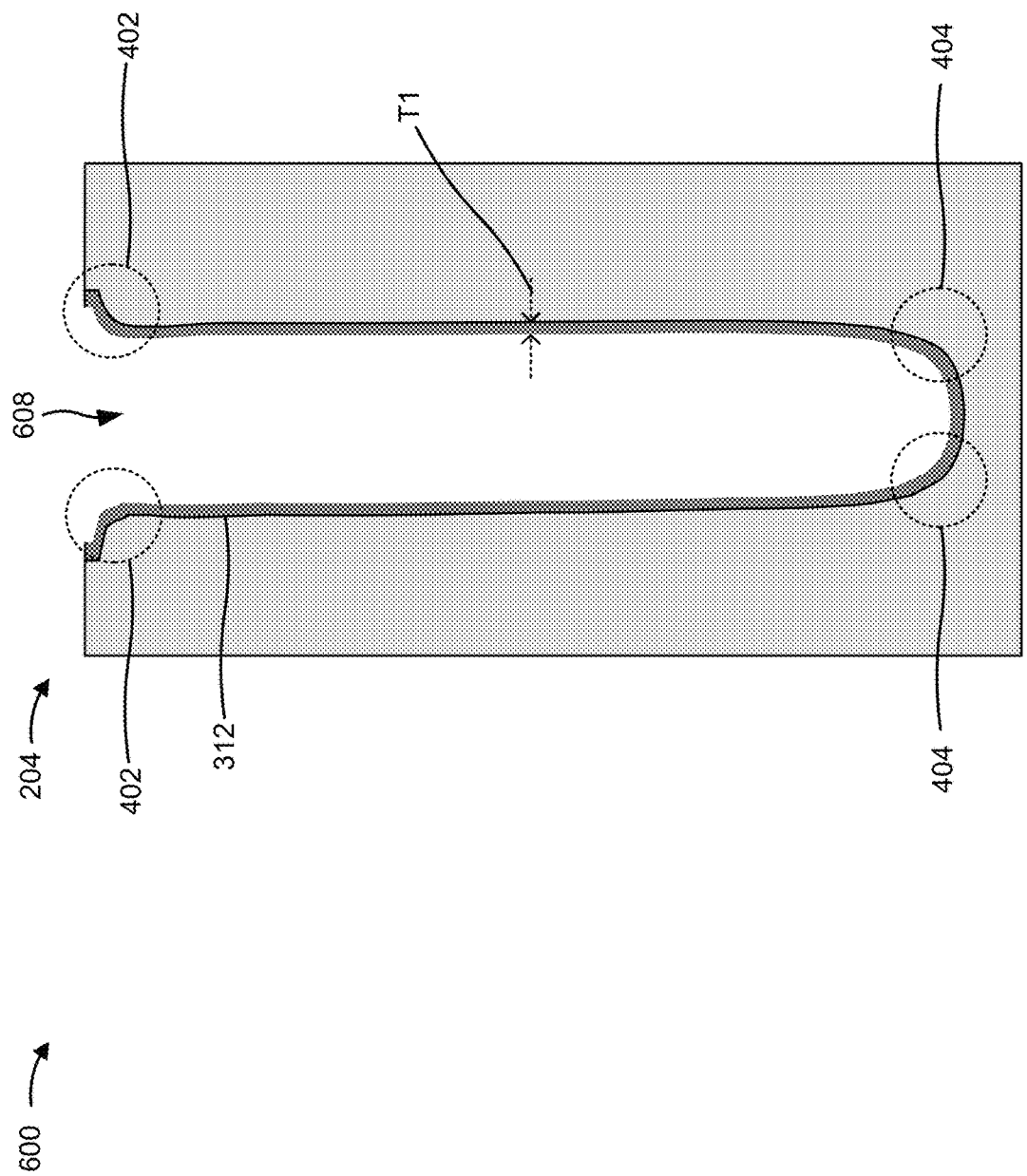

As shown in FIGS. 6G and 6H, the deposition tool 102 may conformally deposit a passivation layer 312 (e.g., a boron layer such as an amorphous boron layer) on the sidewalls of the recess 608 and on the bottom surface of the recess 608 such that the passivation layer 312 lines the recess 608. In some implementations, a boron precursor is used to deposit the passivation layer 312. For example, the deposition tool 102 may use a boron precursor such as diborane ($B_2H_6$) and/or another boron precursor to deposit the passivation layer 312. Other processing chemicals may be used to deposit the passivation layer 312, such as disilane (DCS or $SiH_4$), hydrochloric acid (HCl), and/or tetramethylsilane (TMS or $SiCH_3$), among other examples. As shown in FIG. 6H, the deposition tool 102 may form the passivation layer 312 to a thickness (T1) that is in a range of approximately 5 nanometers to approximately 15 nanometers to enable formation of a continuous film for the passivation layer 312 with a sufficiently low surface roughness. However, other values for the range are within the scope of the present disclosure.

The deposition tool 102 may form the passivation layer 312 by epitaxial growth, where boron in grown or built up on the sidewalls and bottom surface of the recess 608. The deposition tool 102 may use a molecular beam epitaxy technique and/or another epitaxial growth technique to form the passivation layer 312. The boron may be deposited at a temperature that is in a range of approximately 700 degrees Celsius to approximately 800 degrees Celsius to provide sufficient throughput for the epitaxial growth while minimizing the diffusion of boron into the substrate 302. However, other values for the range are within the scope of the present disclosure. The deposition tool 102 may deposit the passivation layer 312 at a pressure that is in a range of approximately 10 torr to approximately 100 torr to provide a sufficient growth rate for the passivation layer 312 and a sufficient absorption coefficient for the passivation layer 312 while minimizing the likelihood of selective loss of silicon particles of the substrate 302. However, other values for the range are within the scope of the present disclosure.

In some implementations, the etch tool 108 performs an etch back operation after the deposition tool 102 forms the passivation layer 312 by epitaxial growth. The etch tool 108 may perform the etch back to remove portions of the passivation layer 312 and to form the passivation layer 312 to a particular shape or profile in the recess 608. The etch tool 108 may perform the etch back using hydrochloric acid (HCl) and/or another etchant to increase the roundness of the top corners 402 and/or to increase the roundness of the bottom corners 404 of the recess 608 and/or of the passivation layer 312 in the recess 608. The deposition tool 102 may perform the etch back operation at a temperature that is included in a range of approximately 700 degrees Celsius to approximate 850 Celsius to reduce the likelihood of damage to the pixel sensor 202 and to achieve an effective silicon etch rate. However, other values for the range are within the scope of the present disclosure.

Figure 6I:
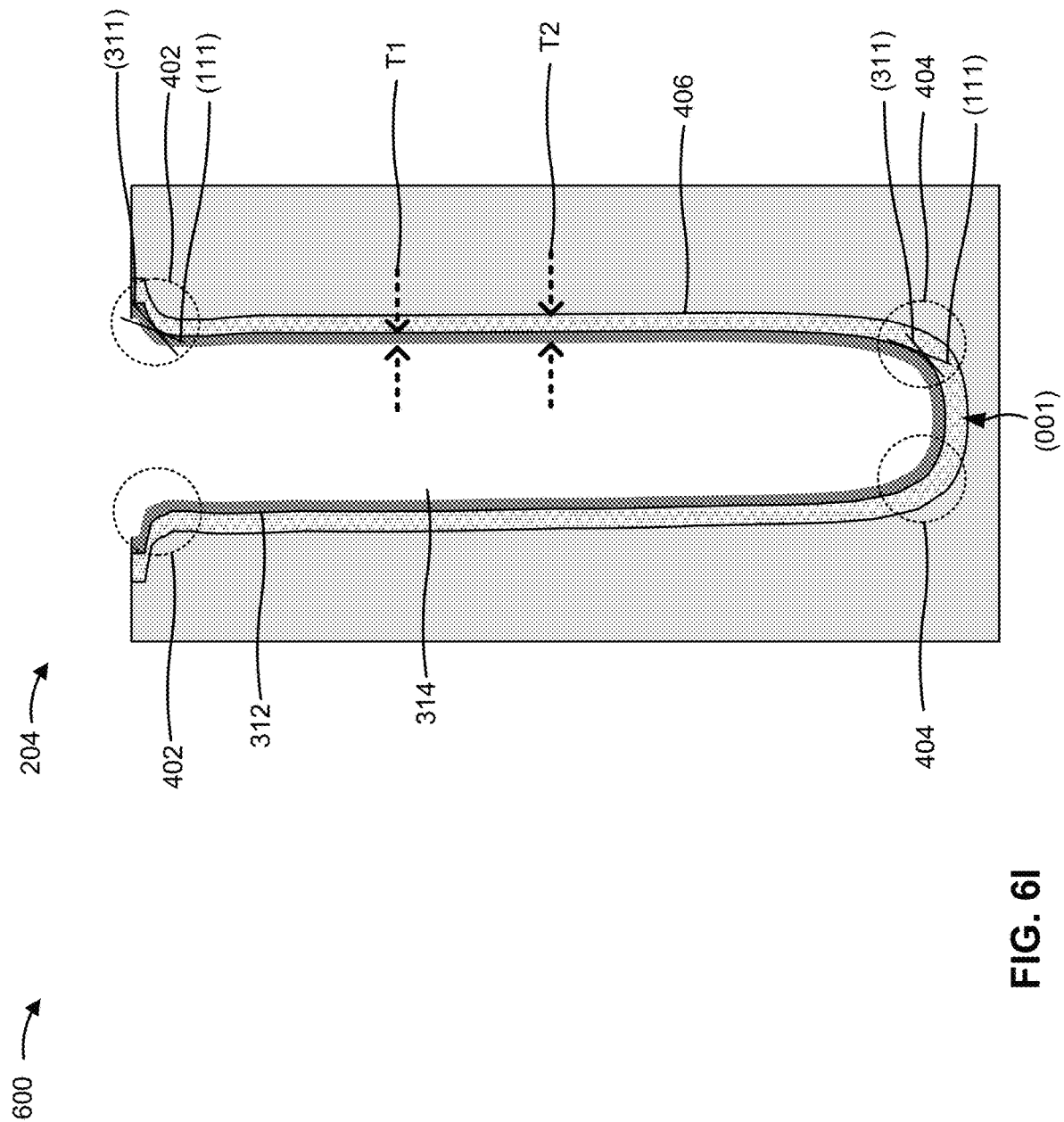

As shown in FIG. 6I, the etch back operation may result in destruction of the crystal plane of the (111) and (311) facet formations at the top corners 402 and/or at the bottom corners 404 of the recess 608. This results in the formation of a combination of facets or grain orientations (e.g., a (111) facet or grain orientation and a (311) facet or grain orientation) at the top corners 402 and/or at the bottom corners 404, in addition to corner rounding at the top corners 402 and/or at the bottom corners 404.

In some implementations, the annealing tool 116 may perform an annealing operation on the passivation layer 312 after the deposition tool 102 forms the passivation layer 312 by epitaxial growth and/or after the etch tool 108 performs the etch back operation. The annealing operation may include a laser-based surface annealing operation and/or another type of annealing operation. The annealing operation may be performed to promote and/or facilitate the diffusion of boron into the substrate 302 corresponding to the sidewalls and the bottom surface of the recess 608. In particular, the annealing tool 116 may perform an annealing operation to precisely control the diffusion length (T2), uniformity, and/or boron concentration in the diffusion region 406 in the substrate 302. This may limit the diffusion length (T2), which may provide sufficient area in the substrate 302 for the photodiode 304. Moreover, the annealing operation may be performed to reduce the surface roughness of the passivation layer 312 and/or of the substrate 302 in the diffusion region 406.

In some implementations, the annealing tool 116 performs the annealing operation using hydrogen (H$_2$) and/or another processing gas. In some implementations, the annealing tool 116 performs the annealing operation at a temperature that is in a range of approximately 750 degrees Celsius to approximately 950 degrees Celsius to promote boron diffusion into the substrate 302 while limiting the diffusion length of the boron into the substrate 302. However, other values for the range are within the scope of the present disclosure. In some implementations, the annealing tool 116 performs the annealing operation at a pressure that is included in a range of approximately 10 torr to approximately 100 torr to achieve the corner rounding of the top corners 402 and/or of the bottom corners 404. However, other values for the range are within the scope of the present disclosure.

In some implementations, the epitaxial growth of the passivation layer 312, the etch back operation, and the annealing operation described above are performed in a single processing chamber (e.g., the same processing chamber). This reduces the likelihood of exposure to contamination between these processing operations. In some implementations, the epitaxial growth of the passivation layer 312, the etch back operation, and the annealing operation described above are performed "in-situ" in the single processing chamber. That is, the epitaxial growth of the passivation layer 312, the etch back operation, and the annealing operation described above are performed without breaking the vacuum in the single processing chamber.

Figure 6J:
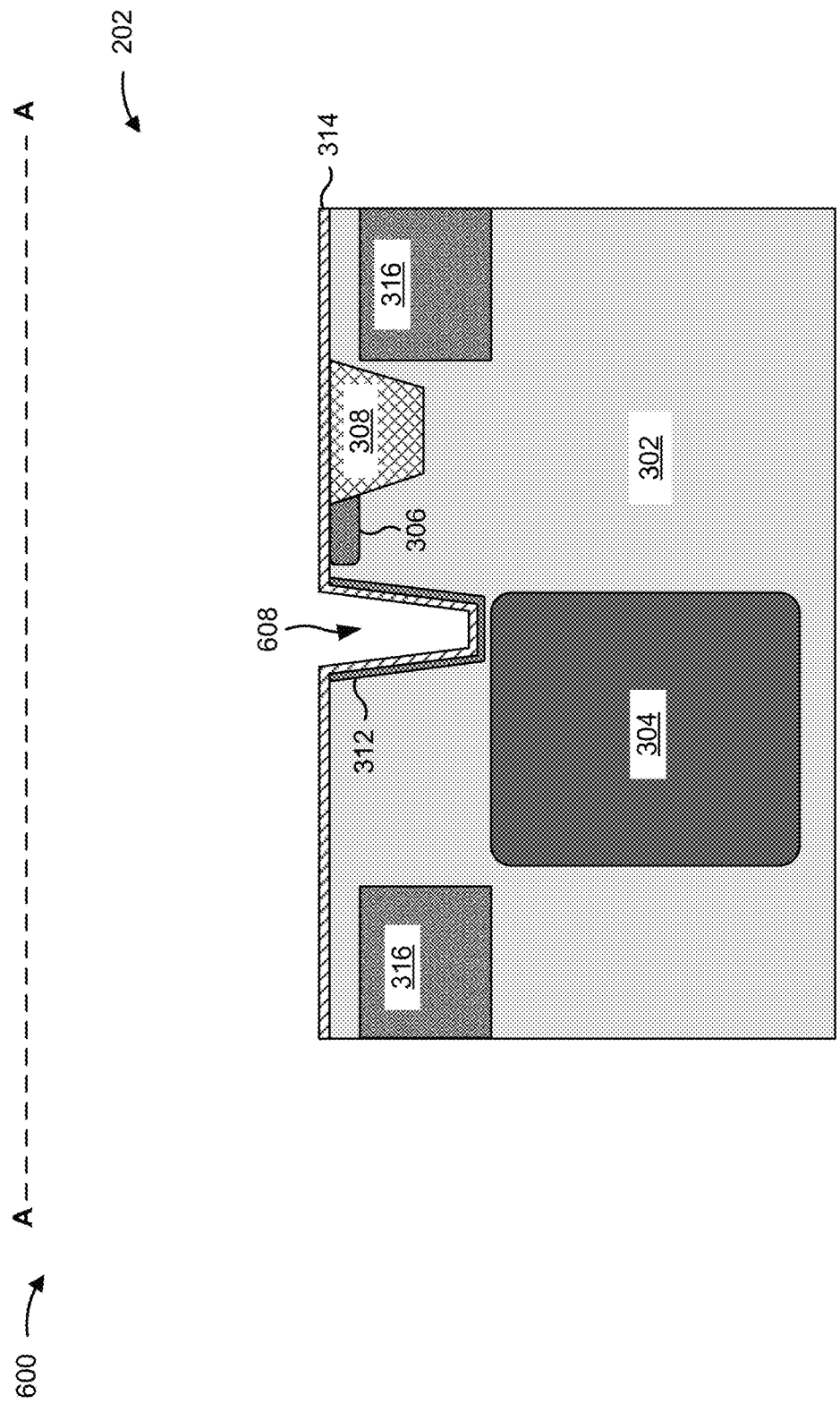
Figure 6K:
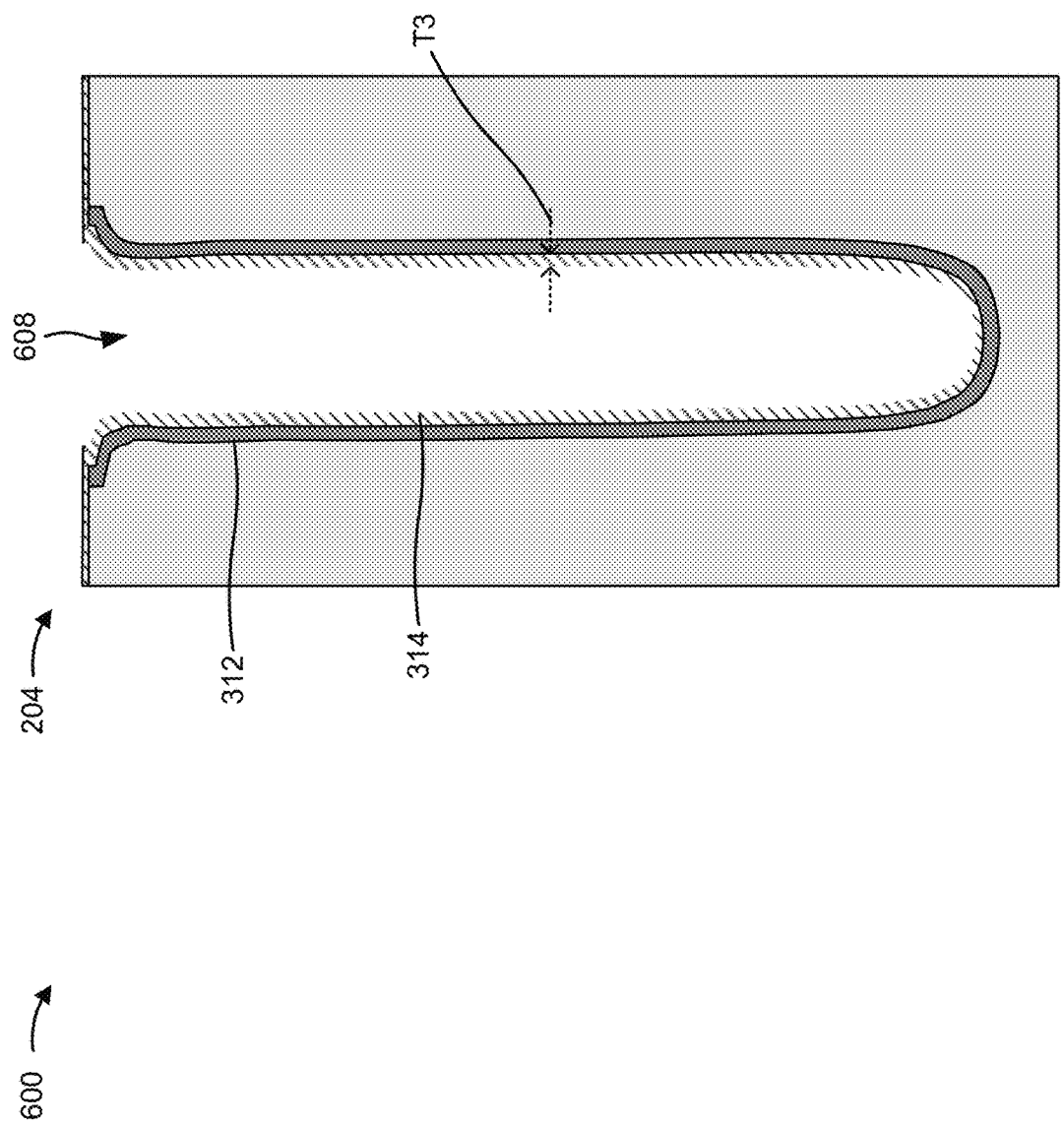

As shown in FIGS. 6J and 6K, a gate dielectric layer 314 of the vertical transfer gate 204 may be formed above and/or over the frontside surface of the substrate 302 and in the recess 608 over and/or on the passivation layer 312. The deposition tool 102 may deposit the gate dielectric layer 314 using a CVD technique, a PVD technique, an ALD technique, or another type of deposition technique. The planarization tool 110 may planarize the gate dielectric layer 314 after the gate dielectric layer 314 is deposited. As shown in FIG. 6K, the gate dielectric layer 314 may be formed to the thickness (T3), which may be included in a range of approximately 65 angstroms to approximately 75 angstroms. However, other values for the range are within the scope of the present disclosure. In some implementations, the deposition tool 102 forms a capping layer 424 (e.g., by epitaxy or another deposition technique) on the passivation layer 312 in the recess 608 prior to formation of the gate dielectric layer 314. The deposition tool 102 may then form the gate dielectric layer 314 over and/or on the capping layer 424 in the recess 608.

Figure 6L:
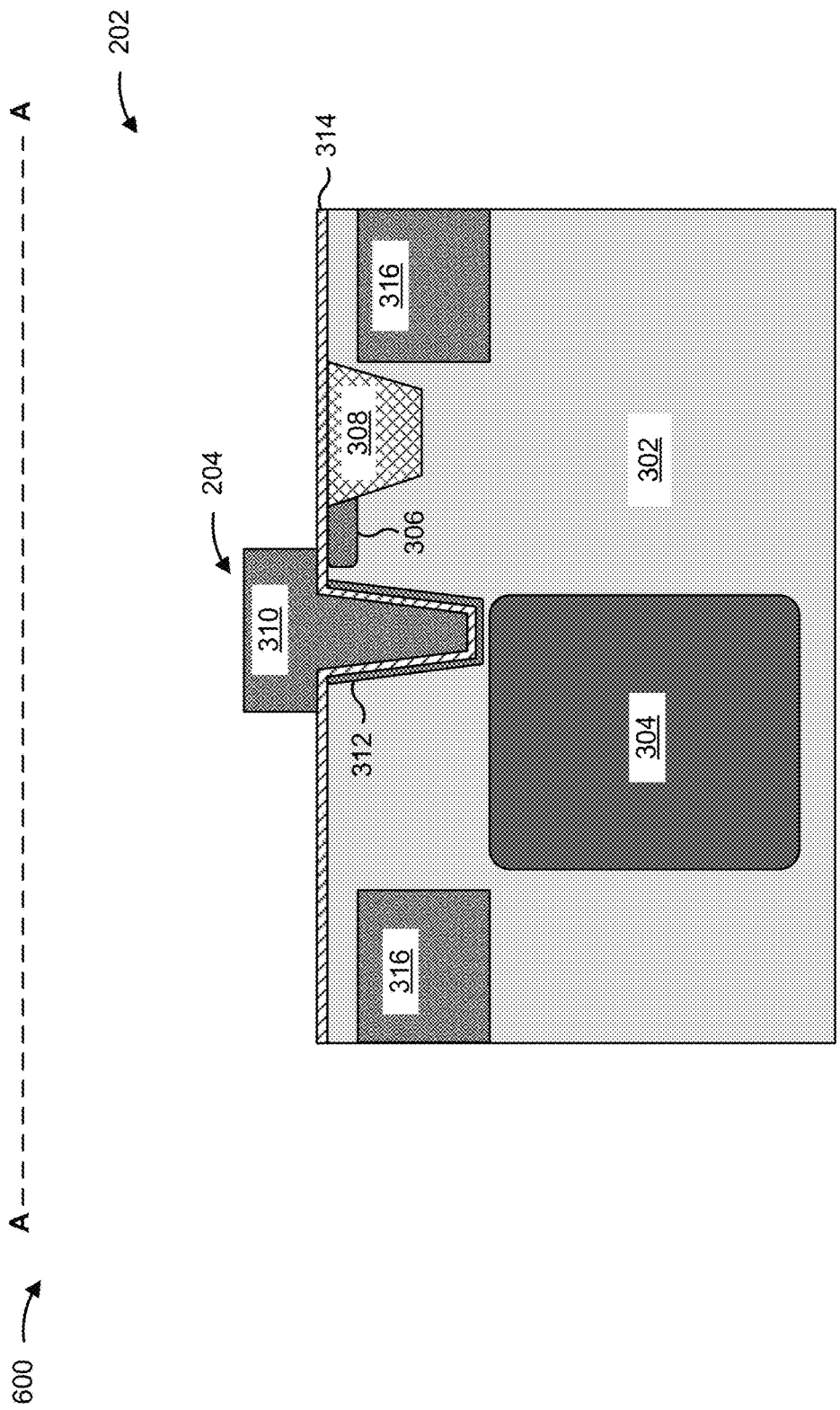

As shown in FIGS. 6L and 6M, a gate electrode 310 of the vertical transfer gate 204 may be formed in the recess 608 over and/or on the gate dielectric layer 314. The gate electrode 310 may be formed over the passivation layer 312 in the recess 608 as well. Moreover, the gate electrode 310 may be formed such that the vertical transfer gate 204 is located above and/or over the photodiode 304 and adjacent to (or side-by-side with) the drain extension region 306 and the drain region 308. The gate electrode 310 may extend into the substrate 302 above and/or over a portion of the photodiode 304. Moreover, a portion of the gate electrode 310 may be formed over the frontside surface of the substrate 302. The deposition tool 102 may deposit one or more n-doped polysilicon layers to form the gate electrode 310 using a CVD technique, a PVD technique, an ALD technique, an epitaxy technique, or another type of deposition technique. Additionally, and/or alternatively, the plating tool 112 and/or the deposition tool 102 may deposit one or more conductive materials to form the gate electrode 310.

As indicated above, FIGS. 6A-6M are provided as an example. Other examples may differ from what is described with regard to FIGS. 6A-6M.

FIGS. 7A-7F are diagrams of an example implementation 700 described herein. Example implementation 700 may include one or more frontside processing operations for forming a pixel sensor 202 described herein, such as the pixel sensor 202 described in connection with FIGS. 3A and 3B. One or more of FIGS. 7A-7F are illustrated along the cross-section A-A of the pixel array 200 in FIGS. 2A and 2B. In some implementations, the operations described in connection with FIGS. 7A-7F may be performed after one or more of the operations described in connection with FIGS. 5A-5D and/or FIGS. 6A-6M.

Figure 7A:
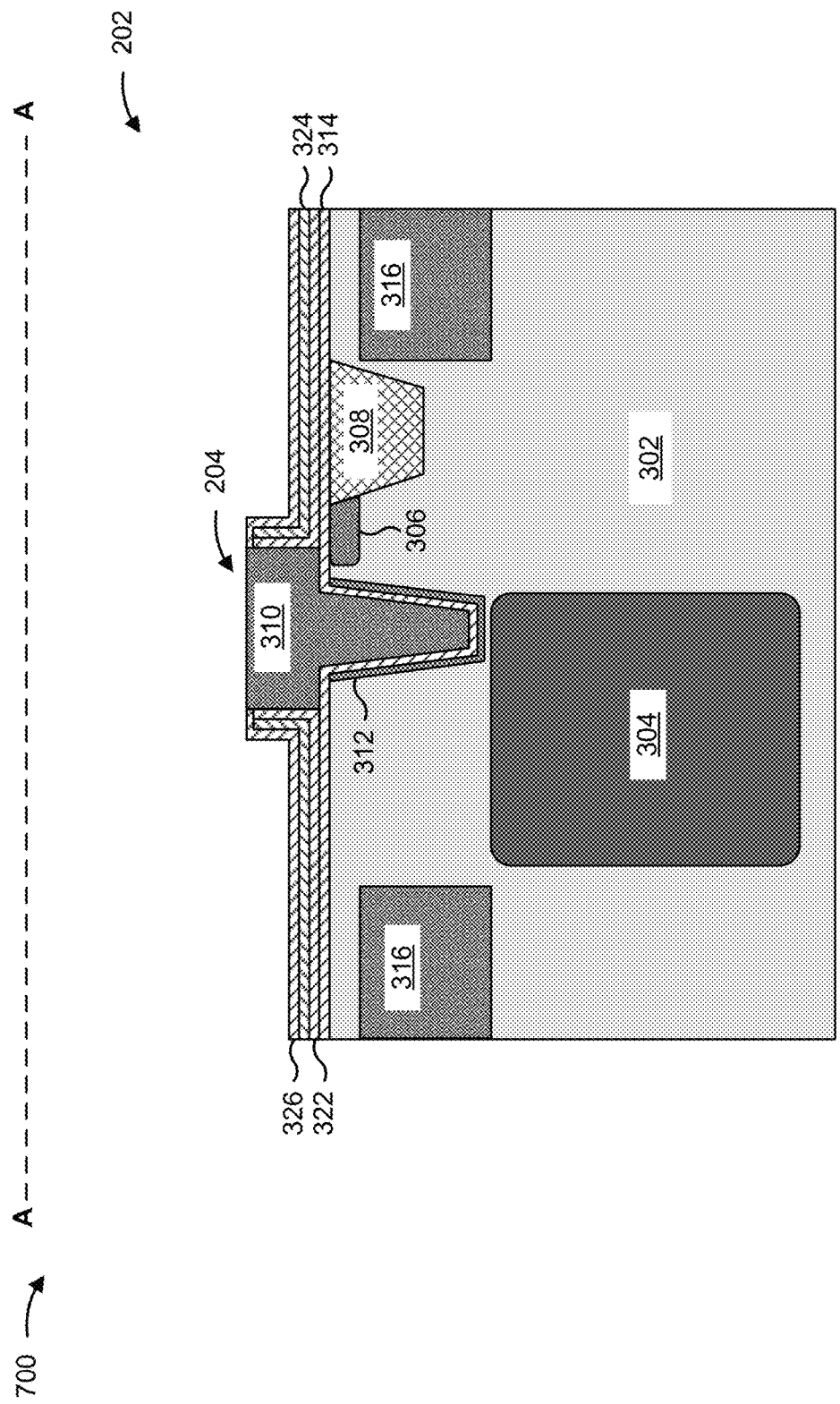
FIGS. 7A-7F are diagrams of an example implementation described herein.

As shown in FIG. 7A, a sidewall oxide layer 322 may be formed over and/or on the gate dielectric layer 314, on the sidewalls of a portion of the gate electrode 310 of the vertical transfer gate 204. The deposition tool 102 may deposit the sidewall oxide layer 322 using a CVD technique, a PVD technique, an ALD technique, or another type of deposition technique. In some implementations, the deposition tool 102 deposits the sidewall oxide layer 322 using a conformal deposition technique. In some implementations, the planarization tool 110 planarizes the sidewall oxide layer 322 after the sidewall oxide layer 322 is deposited.

As further shown in FIG. 7A, the remote plasma oxide (RPO) layer 324 may be formed over and/or on the sidewall oxide layer 322, over the sidewalls of the portion of the gate electrode 310 of the vertical transfer gate 204. The deposition tool 102 may deposit the remote plasma oxide layer 324 using a CVD technique, a PVD technique, an ALD technique, or another type of deposition technique. In some implementations, the deposition tool 102 deposits the remote plasma oxide layer 324 using a conformal deposition technique. In some implementations, the planarization tool 110 planarizes the remote plasma oxide layer 324 after the remote plasma oxide layer 324 is deposited.

As further shown in FIG. 7A, the contact etch stop layer (CESL) 326 may be formed over and/or on the remote plasma oxide layer 324, over the sidewalls of the portion of the gate electrode 310 of the vertical transfer gate 204. The deposition tool 102 may deposit the contact etch stop layer 326 using a CVD technique, a PVD technique, an ALD technique, or another type of deposition technique. In some implementations, the deposition tool 102 deposits the contact etch stop layer 326 using a conformal deposition technique. In some implementations, the planarization tool 110 planarizes the contact etch stop layer 326 after the contact etch stop layer 326 is deposited.

Figure 7B:
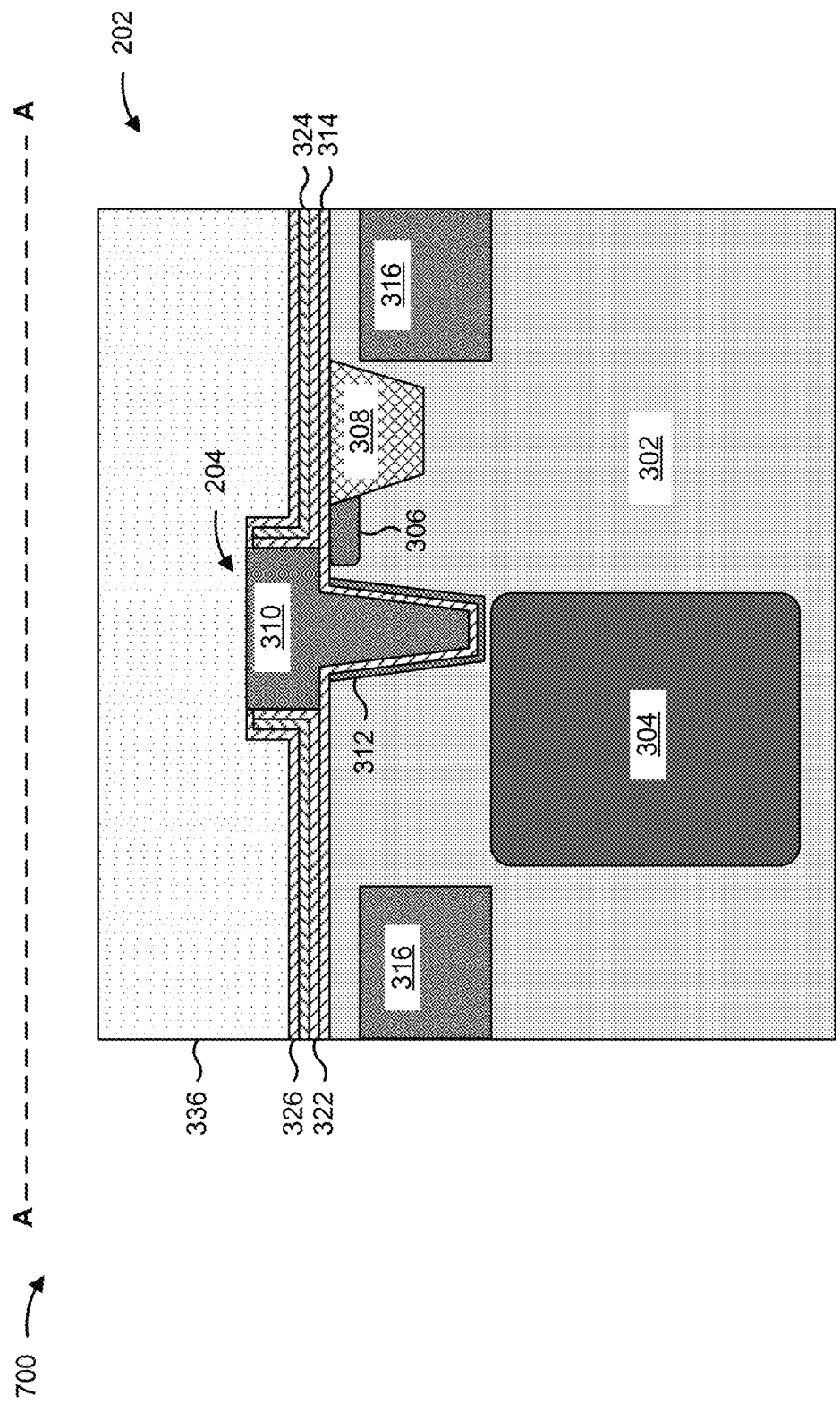

As shown in FIG. 7B, the dielectric layer(s) 336 may be formed over and/or on the contact etch stop layer 326, and over and/or on the gate electrode 310 of the vertical transfer gate 204. The deposition tool 102 may deposit the dielectric layer(s) 336 using a CVD technique, a PVD technique, and LAD technique, and/or another deposition technique.

Figure 7C:
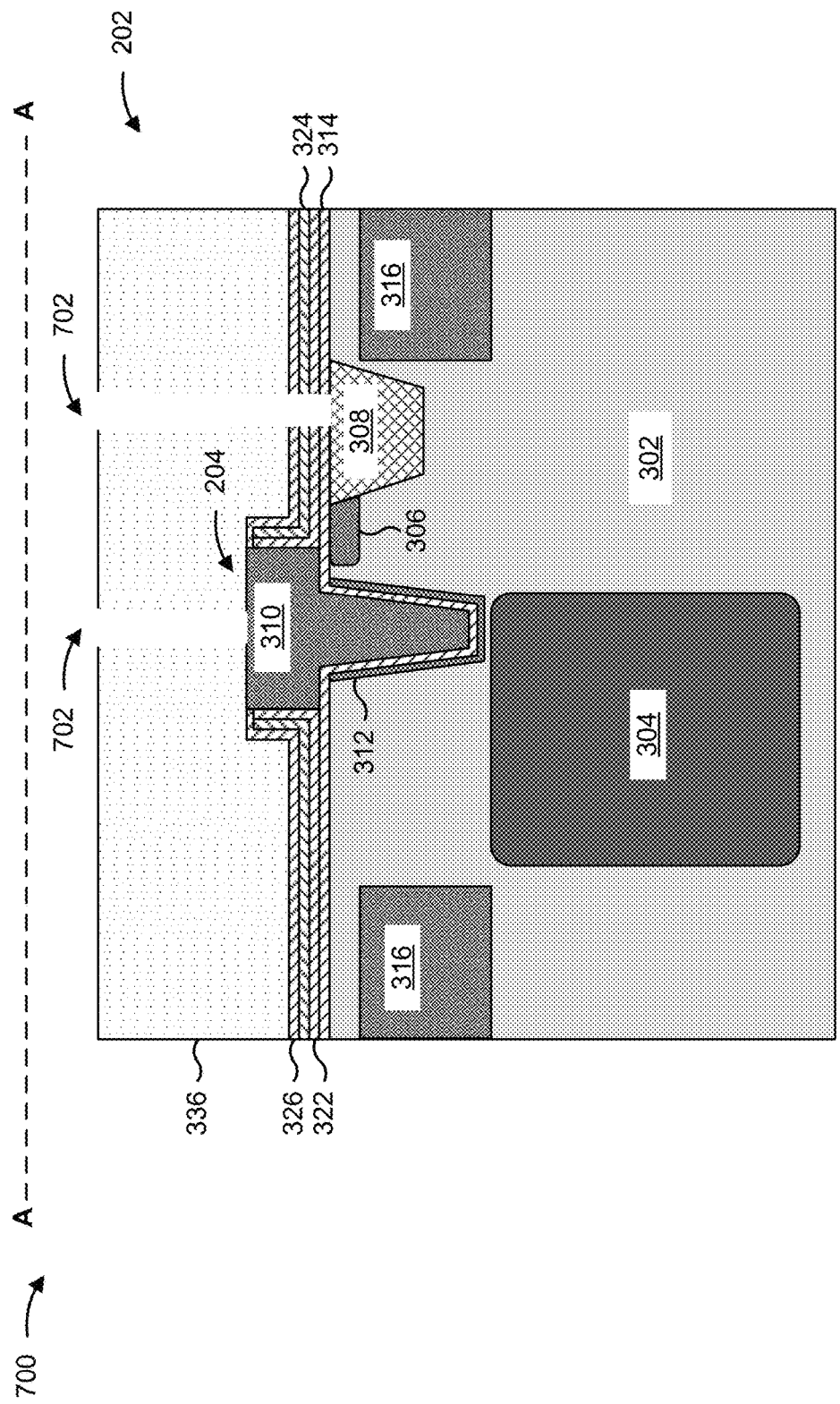

As shown in FIG. 7C, the etch tool 108 forms openings 702 in the dielectric layer(s) 336. The etch tool 108 may form an opening 702 over the vertical transfer gate 204 and through the dielectric layer(s) 336 to the gate electrode 310. The etch tool 108 may also form another opening 702 over the drain region 308 and through the dielectric layer(s) 336 to the drain region 308.

Figure 7D:
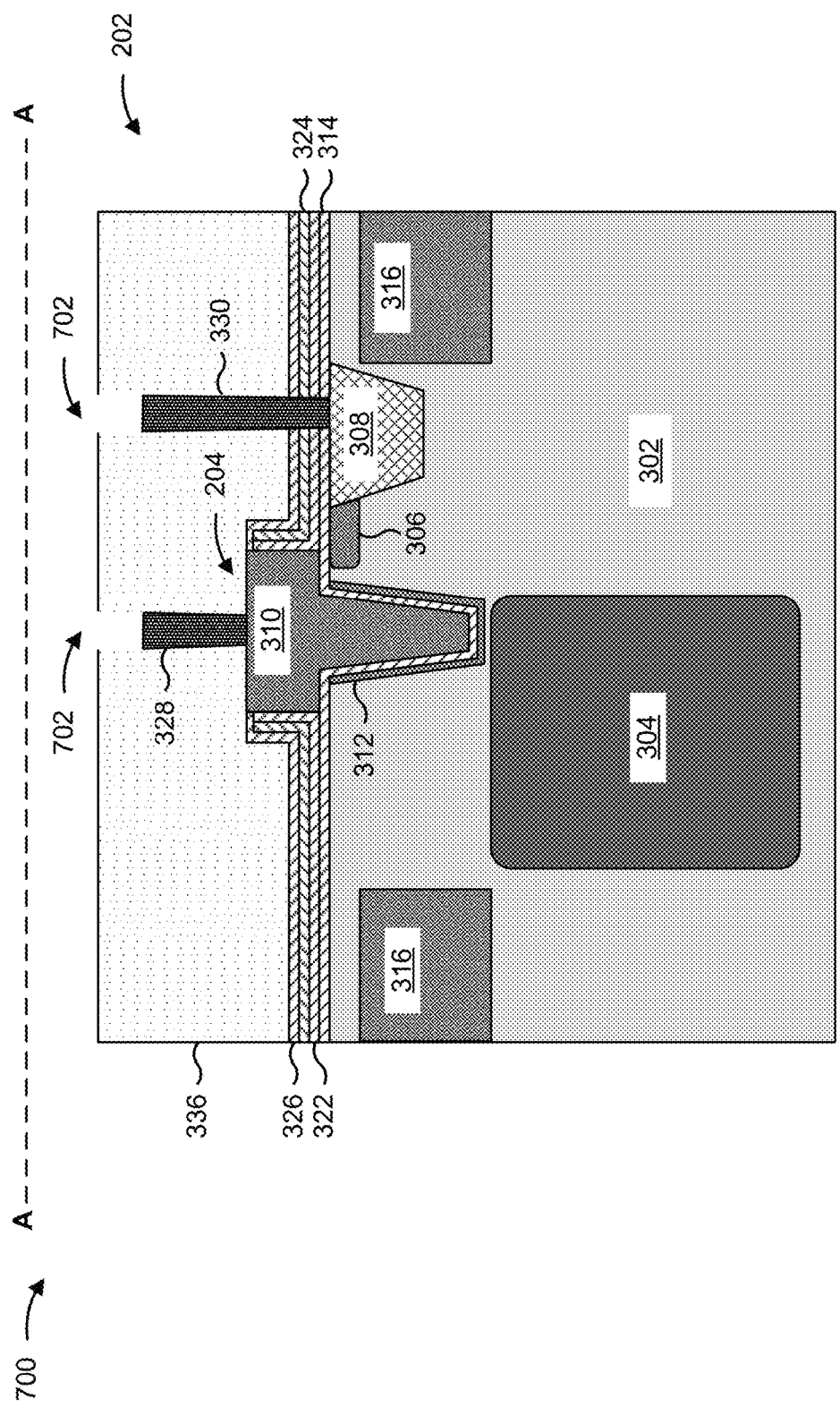

As shown in FIG. 7D, the interconnects 328 and 330 may be formed in the openings 702 in the dielectric layer(s) 336. The interconnect 328 may be formed such that the interconnect 328 is electrically connected with and/or contacts the gate electrode 310 of the vertical transfer gate 204. The interconnect 330 may be formed such that the interconnect 330 is electrically connected with and/or contacts the drain region 308. The deposition tool 102 may deposit the material of the interconnects 328 and 330 using a CVD technique, a PVD technique, an ALD technique, or another type of deposition technique, the plating tool 112 may deposit the material of the interconnects 328 and 330 using an electroplating operation, or a combination thereof. The planarization tool 110 may planarize the interconnects 328 and 330 after the interconnects 328 and 330 are deposited.

Figure 7E:
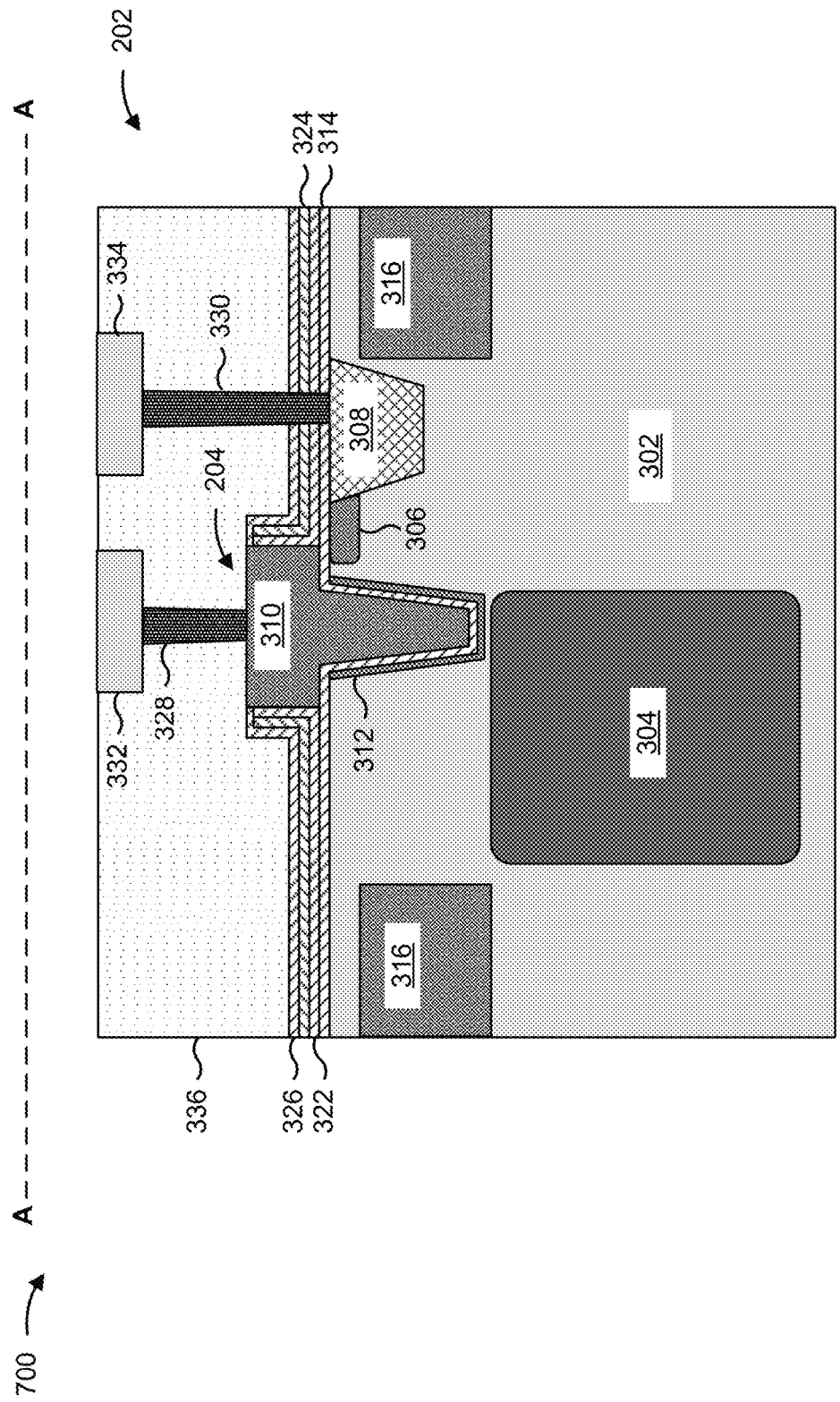

As shown in FIG. 7E, the metallization layers 332 and 334 may be formed in the openings 702 in the dielectric layer(s) 336. In particular, the metallization layer 332 may be electrically connected to the vertical transfer gate 204 by the interconnect 328, and the metallization layer 334 may be electrically connected to the drain region 308 by the interconnect 330. The deposition tool 102 may deposit the material of the metallization layers 332 and 334 using a CVD technique, a PVD technique, an ALD technique, or another type of deposition technique, the plating tool 112 may deposit the material of the metallization layers 332 and 334 using an electroplating operation, or a combination thereof. The planarization tool 110 may planarize the metallization layers 332 and 334 after the metallization layers 332 and 334 are deposited.

Figure 7F:
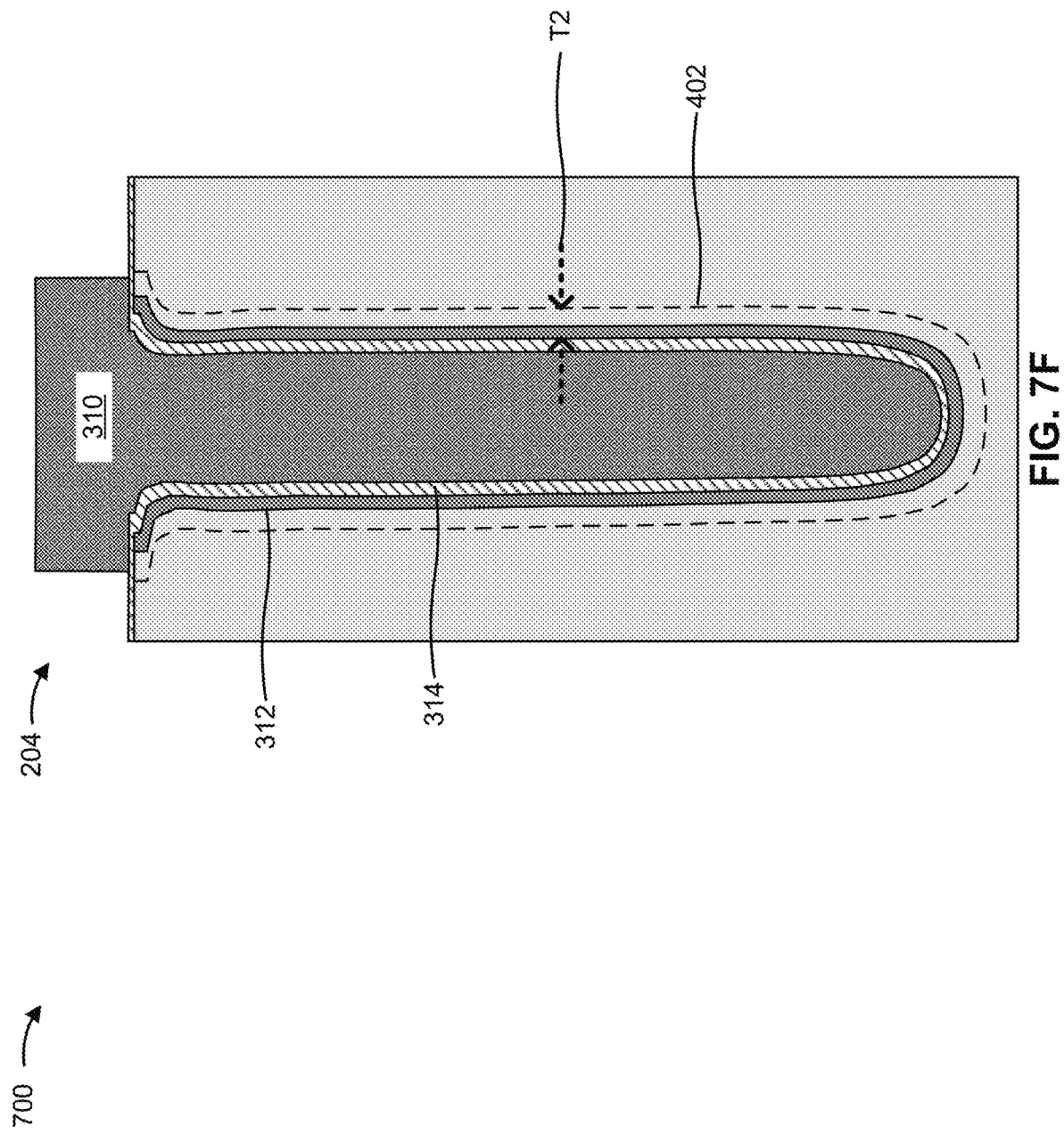

As shown in FIG. 7F, boron from the passivation layer 312 may diffuse into the silicon of the substrate 302 surrounding the vertical transfer gate 204. The diffusion may occur during one or more of the frontside processing operations described in connection with FIGS. 7A-7E. In particular, the pixel sensor 202 may be exposed to elevated temperatures during a deposition operation, an annealing operation, an etch operation, and/or another frontside processing operation, which may cause boron in the passivation layer 312 to diffuse into the silicon of the substrate 302 surrounding the vertical transfer gate 204. The techniques for forming the shape and profile of the recess 608 described in connection with FIGS. 6D and 6F, and the techniques for forming the profile and boron concentration of the passivation layer 312 described in connection with FIGS. 6G and 6H, may result in reduced diffusion length (T2) for the boron of the passivation layer 312 into the silicon of the substrate 302. For example, the diffusion length (T2) may be less than approximately 80 nanometers. As another example, the diffusion length (T2) may be in a range of approximately 70 nanometers to approximately 80 nanometers. As another example, the diffusion length (T2) may be in a range of approximately 50 nanometers to approximately 70 nanometers. However, other values for the range of the diffusion length (T2) are within the scope of the present disclosure.

As indicated above, FIGS. 7A-7F are provided as an example. Other examples may differ from what is described with regard to FIGS. 7A-7F.

Figure 8A:
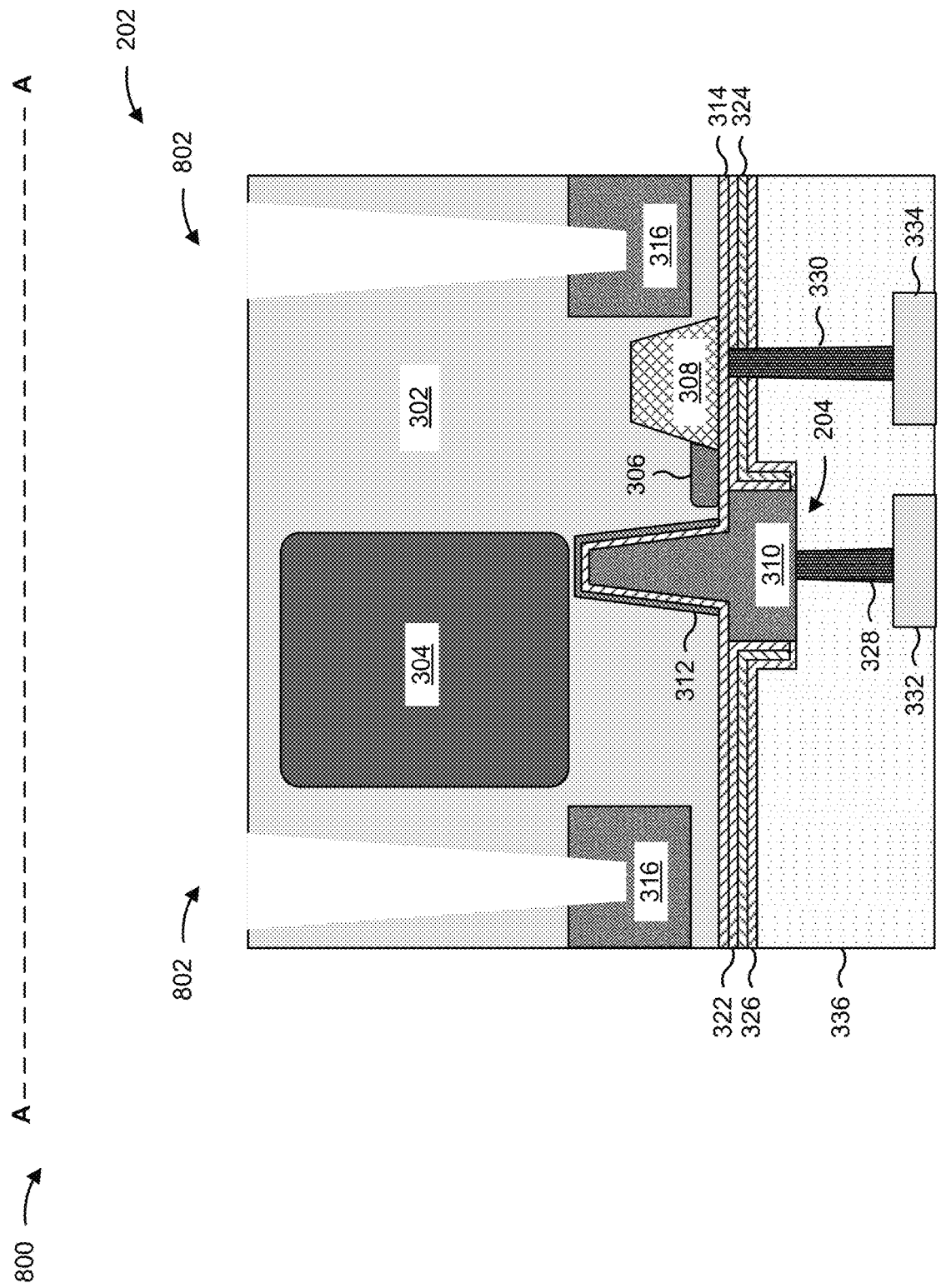
FIGS. 8A-8C are diagrams of an example implementation described herein.
Figure 8B:
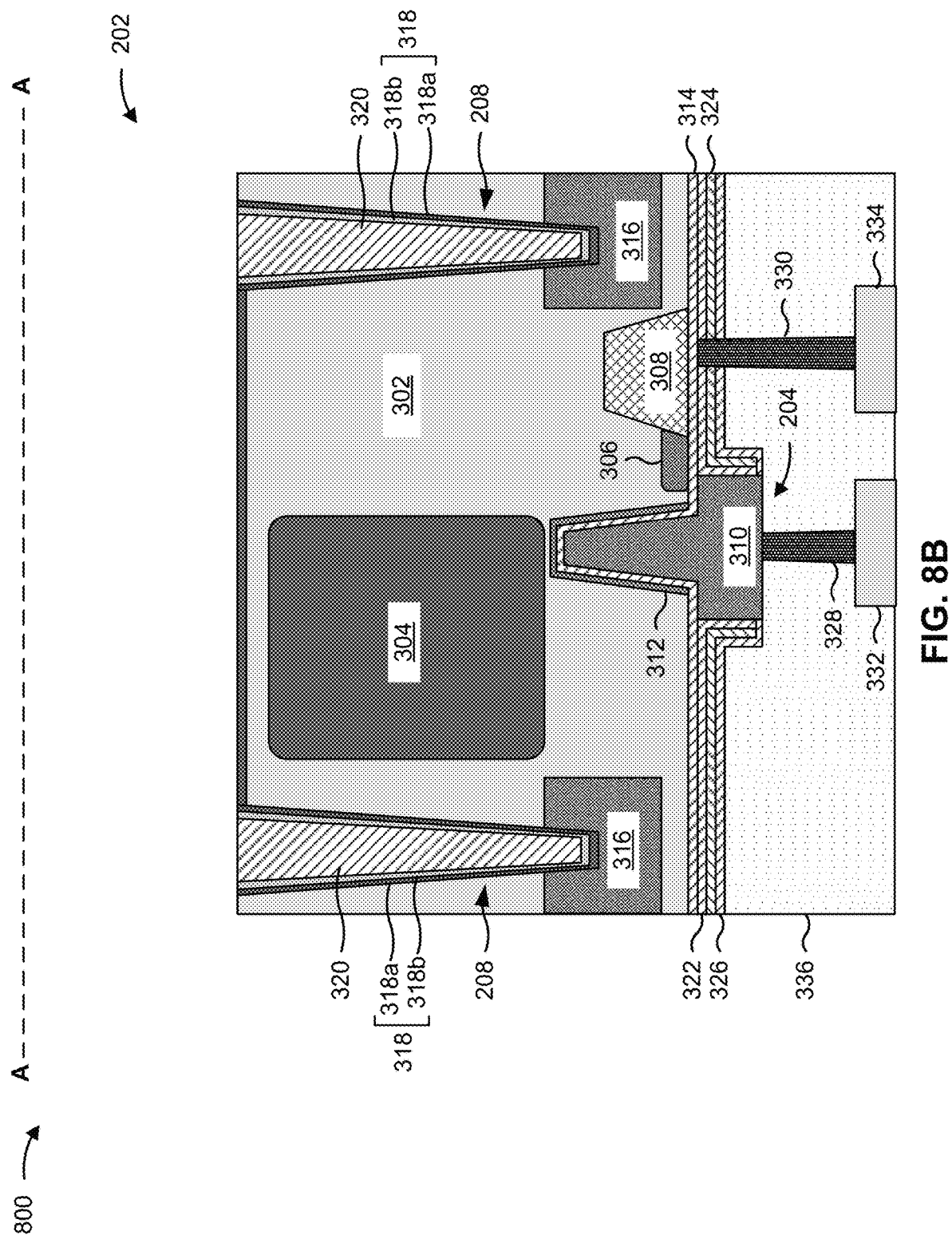
Figure 8C:
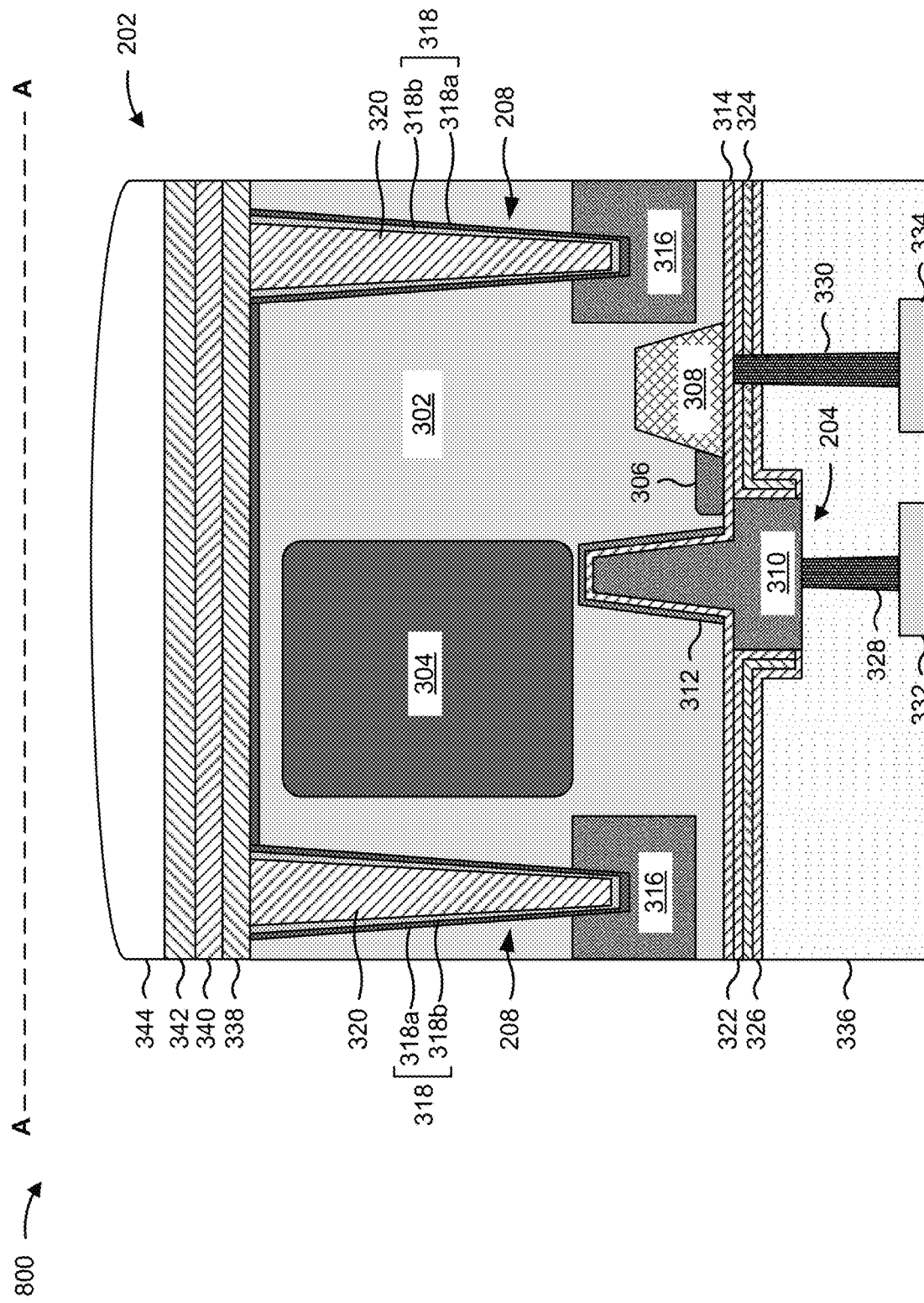

FIGS. 8A-8C are diagrams of an example implementation 800 described herein. Example implementation 800 may include one or more backside processing operations for forming a pixel sensor 202 described herein, such as the pixel sensor 202 described in connection with FIGS. 3A and 3B. One or more of FIGS. 8A-8C are illustrated along the cross-section A-A of the pixel array 200 in FIGS. 2A and 2B. In some implementations, the operations described in connection with FIGS. 8A-8C may be performed after one or more of the operations described in connection with FIGS. 5A-5D, FIGS. 6A-6M, and/or FIGS. 7A-7F.

As shown in FIG. 8A, the substrate 302 above the deep p-well region 316 may be etched to form a trench 802 (or another type of recess) in the substrate 302. The trench 802 may be etched into the substrate 302 from the backside surface of the substrate 302, which may be an opposing side of the substrate 302 on which the vertical transfer gate 204 is formed. The trench 802 may be formed such that the trench 802 surrounds the photodiode 304, the drain extension region 306, the drain region 308, and the vertical transfer gate 204. In some implementations, the trench 802 is formed such that the trench 802 partially extends into the deep p-well region 316.

The deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 (and, in some cases, portions of the deep p-well region 316) to form the trench 802. In some implementations, a photoresist removal tool removes the remaining portions of the photoresist layer (e.g., using a chemical stripper, a plasma asher, and/or another technique) after the etch tool 108 etches the substrate 302 (and, in some cases, the deep p-well region 316) to form the trench 802.

As shown in FIG. 8B, the trench 802 may be lined with one or more layers 318. The deposition tool 102 may form the one or more layers 318 by conformal deposition such that the one or more layers 318 are formed as thin films that conform to the shape and/or profile of the sidewalls and bottom surface of the trench 802. The one or more layers 318 may include a passivation layer 318a (e.g., an amorphous boron layer), a capping layer 318b, and/or another layer. The deposition tool 102 may form the one or more layers 318 by epitaxial growth using a molecular beam epitaxy technique and/or another epitaxy technique.

As further shown in FIG. 8B, the trench 802 may be filled with an oxide material to form an oxide layer 320 of the DTI structure 208. The deposition tool 102 may form the oxide layer 320 over the passivation layer 318a, over the capping layer 318b, and/or on the capping layer 318b. The deposition tool 102 may deposit the oxide layer 320 using a CVD technique, a PVD technique, an ALD technique, or another type of deposition technique. The planarization tool 110 may planarize the oxide layer 320 after the oxide layer 320 is deposited in the trench 802 such that a top surface of the oxide layer 320 and a backside surface of the substrate 302 are approximately a same height. In some implementations, the passivation layer 318a extends along the backside surface of the substrate 302 between opposing sides of the DTI structure 208, as shown in the example in FIG. 8B.

As shown in FIG. 8C, additional layers and/or structures may be formed for the pixel sensor 202. For example, a p+ ion layer 338, an ARC 340, a color filter layer 342, and a micro-lens layer 344 may be formed over the backside side of the substrate 302. The deposition tool 102 may deposit the p+ ion layer 338, the ARC 340, the color filter layer 342, and the micro-lens layer 344 using a CVD technique, a PVD technique, an ALD technique, or another type of deposition technique. The p+ ion layer 338 may be formed over and/or on the substrate 302, over and/or on the DTI structure 208, and/or over and/or on the passivation layer 318a. The ARC 340 may be formed over and/or on the p+ ion layer 338. The color filter layer 342 may be formed over and/or on the ARC 340. The micro-lens layer 344 may be formed over and/or on the color filter layer 342. In some implementations, the planarization tool 110 planarizes the p+ ion layer 338, the ARC 340, and/or the color filter layer 342.

As indicated above, FIGS. 8A-8C are provided as an example. Other examples may differ from what is described with regard to FIGS. 8A-8C.

Figure 9:
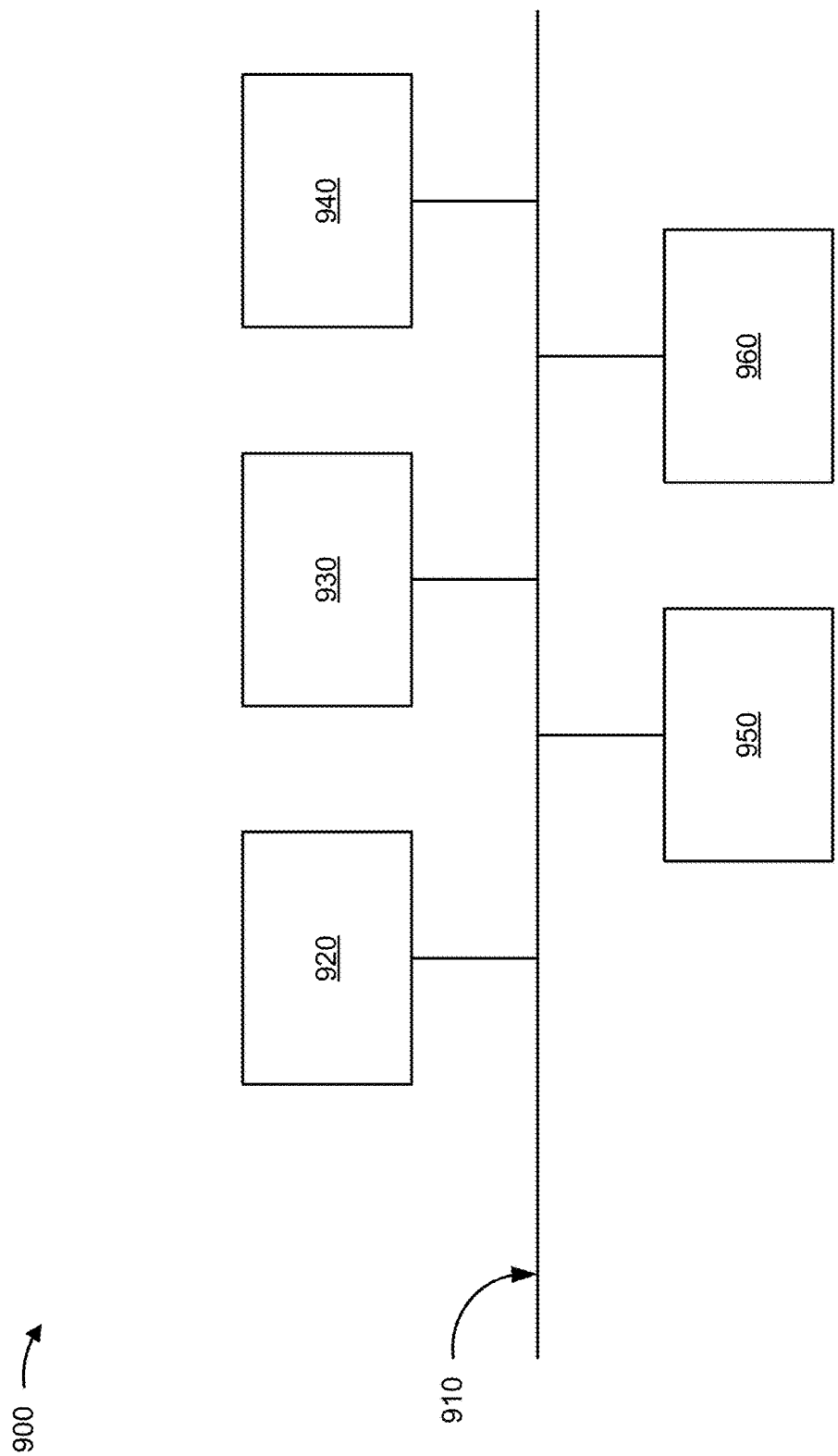
FIG. 9 is a diagram of example components of one or more devices described herein.

FIG. 9 is a diagram of example components of a device 900 described herein. In some implementations, one or more of the semiconductor processing tools 102-116 and/or the wafer/die transport tool 118 may include one or more devices 900 and/or one or more components of device 900. As shown in FIG. 9, device 900 may include a bus 910, a processor 920, a memory 930, an input component 940, an output component 950, and a communication component 960.

Bus 910 may include one or more components that enable wired and/or wireless communication among the components of device 900. Bus 910 may couple together two or more components of FIG. 9, such as via operative coupling, communicative coupling, electronic coupling, and/or electric coupling. Processor 920 may include a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 may include one or more processors capable of being programmed to perform one or more operations or processes described elsewhere herein.

Memory 930 may include volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 may include one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
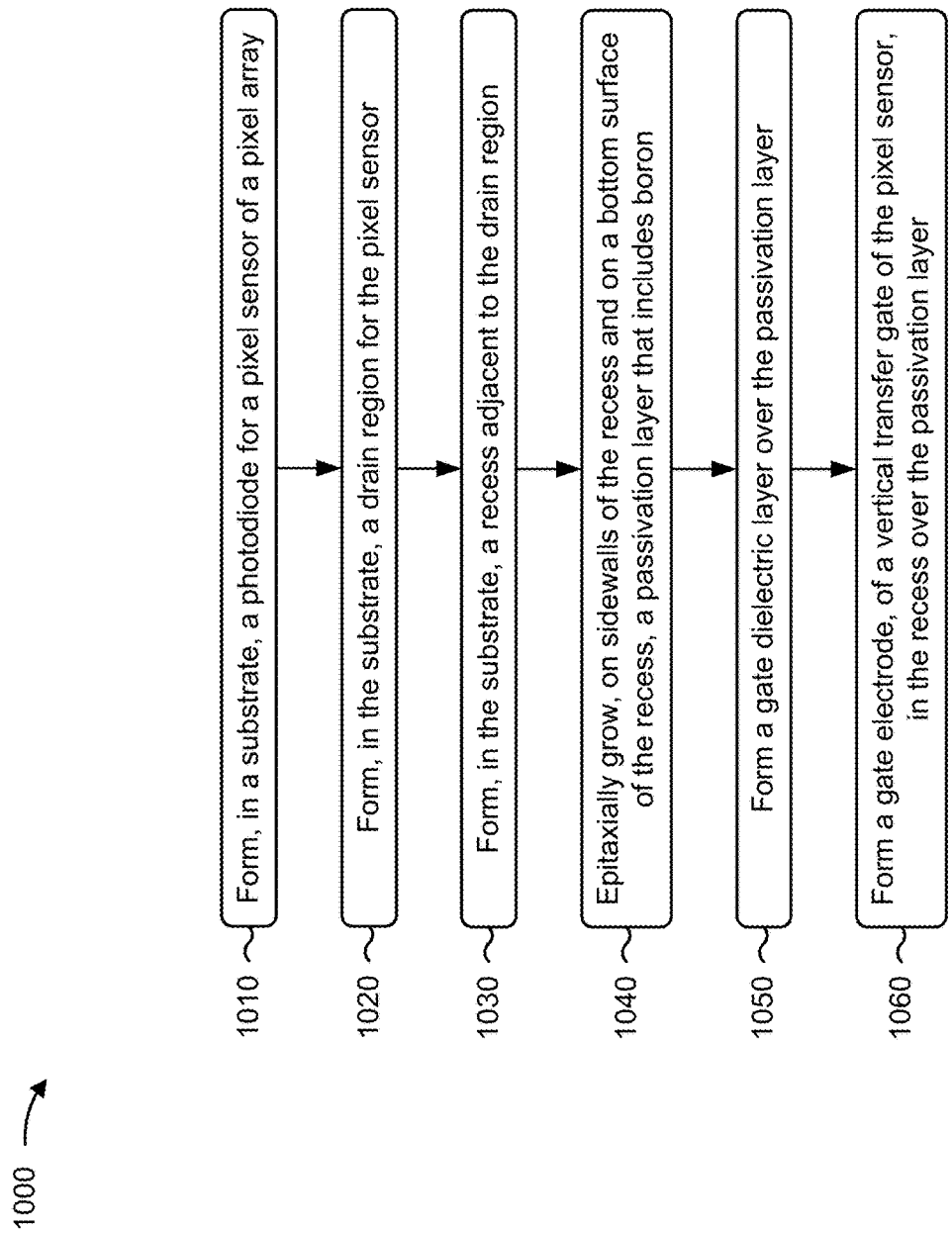
FIGS. 10 and 11 are flowcharts of example processes associated with forming a pixel sensor described herein.

FIG. 10 is a flowchart of an example process 1000 associated with forming a pixel sensor described herein. In some implementations, one or more process blocks of FIG. 10 are performed by one or more semiconductor processing tools (e.g., one or more of the semiconductor processing tools 102-116). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming, in a substrate, a photodiode for a pixel sensor of a pixel array (block 1010). For example, one or more of the semiconductor processing tools 102-116 may form, in a substrate 302, a photodiode 304 for a pixel sensor (202) of a pixel array 200, as described herein.

As further shown in FIG. 10, process 1000 may include forming, in the substrate, a drain region for the pixel sensor (block 1020). For example, one or more of the semiconductor processing tools 102-116 may form, in the substrate 302, a drain region 308 for the pixel sensor 202, as described herein.

As further shown in FIG. 10, process 1000 may include forming, in the substrate, a recess adjacent to the drain region (block 1030). For example, one or more of the semiconductor processing tools 102-116 may form, in the substrate 302, a recess 608 adjacent to the drain region 308, as described herein.

As further shown in FIG. 10, process 1000 may include epitaxially growing, on sidewalls of the recess and on a bottom surface of the recess, a passivation layer that includes boron (block 1040). For example, one or more of the semiconductor processing tools 102-116 may epitaxially grow, on sidewalls of the recess 608 and on a bottom surface of the recess 608, a passivation layer 312 that includes boron, as described herein.

As further shown in FIG. 10, process 1000 may include forming a gate dielectric layer (320) over the passivation layer (block 1050). For example, one or more of the semiconductor processing tools 102-116 may form a gate dielectric layer 314 over the passivation layer 312, as described herein.

As further shown in FIG. 10, process 1000 may include forming a gate electrode, of a vertical transfer gate of the pixel sensor, in the recess over the passivation layer (block 1060). For example, one or more of the semiconductor processing tools 102-116 may form a gate electrode 310, of a vertical transfer gate 204 of the pixel sensor 202, in the recess 608 over the passivation layer 312, as described herein.

Process 1000 may include additional implementations, such as any single implementation or any combination of implementations described below and/or in connection with one or more other processes described elsewhere herein.

In a first implementation, epitaxially growing the passivation layer 312 includes epitaxially growing the passivation layer 312 to a thickness that is included in a range of approximately 5 nanometers to approximately 15 nanometers. In a second implementation, alone or in combination with the first implementation, epitaxially growing the passivation layer 312 includes epitaxially growing the passivation layer 312 at a temperature that is in a range of approximately 700 degrees Celsius to approximately 800 degrees Celsius. In a third implementation, alone or in combination with one or more of the first and second implementations, epitaxially growing the passivation layer 312 includes epitaxially growing the passivation layer 312 at a pressure that is in a range of approximately 10 torr to approximately 100 torr. In a fourth implementation, alone or in combination with one or more of the first through third implementations, epitaxially growing the passivation layer 312 includes epitaxially growing the passivation layer 312 using a diborane ($B_2H_6$) boron precursor.

In a fifth implementation, alone or in combination with one or more of the first through fourth implementations, process 1000 includes performing, after epitaxially growing the passivation layer 312, an annealing operation to cause boron from the passivation layer 312 to diffuse into the sidewalls and into the bottom surface of the recess 608. In a sixth implementation, alone or in combination with one or more of the first through fifth implementations, performing the annealing operation includes performing the annealing operation at a temperature that is in a range of approximately 750 degrees Celsius to approximately 950 degrees Celsius. In a seventh implementation, alone or in combination with one or more of the first through sixth implementations, a diffusion length of the passivation layer 312 into the substrate 302, after front end processing of the pixel sensor 202, is included in a range of approximately 70 nanometers to approximately 80 nanometers.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
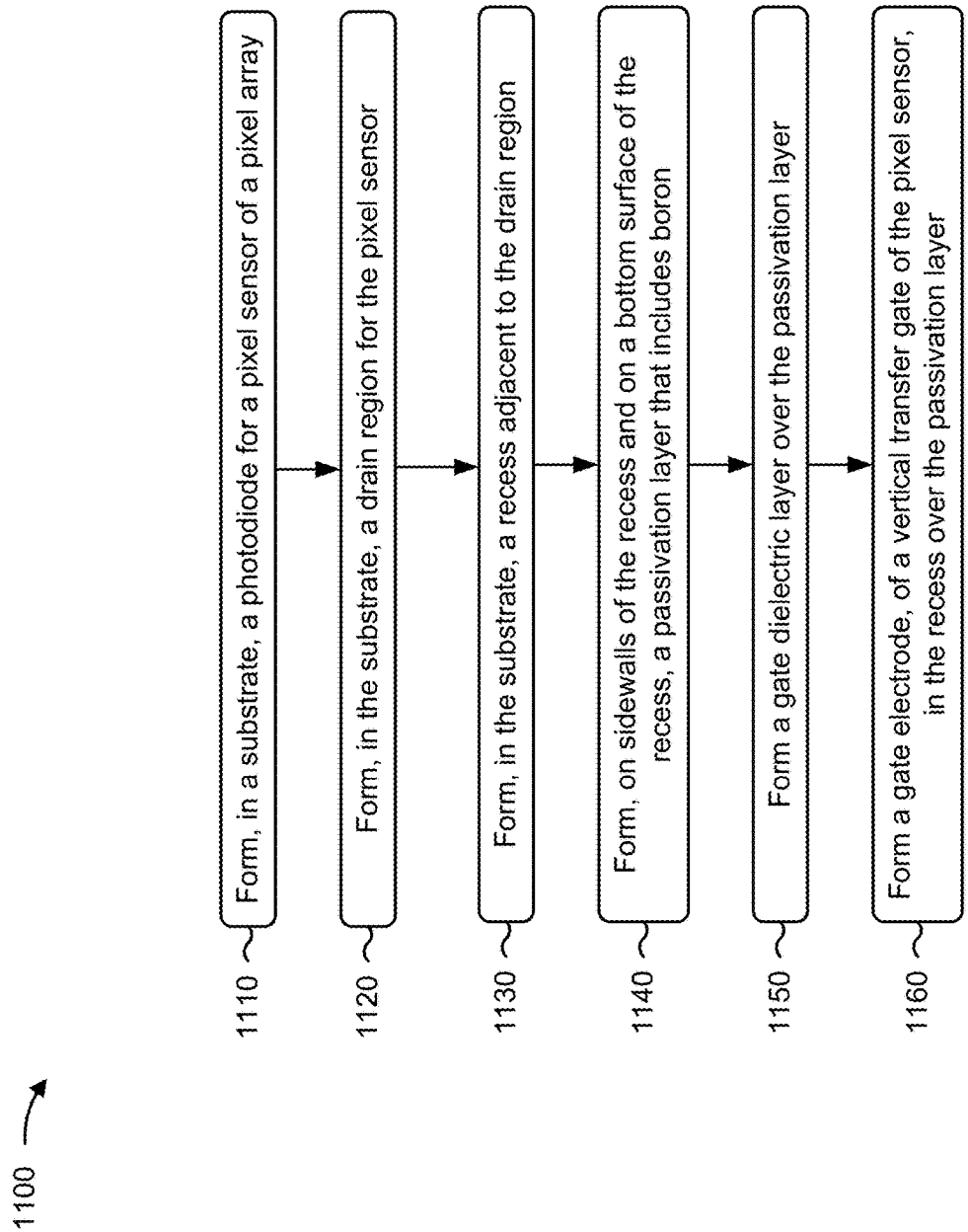

FIG. 11 is a flowchart of an example process 1100 associated with forming a pixel sensor described herein. In some implementations, one or more process blocks of FIG. 11 are performed by one or more semiconductor processing tools (e.g., one or more of the semiconductor processing tools 102-116). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include forming, in a substrate, a photodiode for a pixel sensor of a pixel array (block 1110). For example, one or more of the semiconductor processing tools 102-116 may form, in a substrate 302, a photodiode 304 for a pixel sensor 202 of a pixel array 200, as described herein.

As further shown in FIG. 11, process 1100 may include forming, in the substrate, a drain region for the pixel sensor (block 1120). For example, one or more of the semiconductor processing tools 102-116 may form, in the substrate 302, a drain region 308 for the pixel sensor 202, as described herein.

As further shown in FIG. 11, process 1100 may include forming, in the substrate, a recess adjacent to the drain region (block 1130). For example, one or more of the semiconductor processing tools 102-116 may form, in the substrate 302, a recess 608 adjacent to the drain region 308, as described herein. In some implementations, the recess 608 is formed such that at least one of a top corner 402 of the recess or a bottom corner 404 of the recess includes a combination of a (311) facet and a (111) facet.

As further shown in FIG. 11, process 1100 may include forming, on sidewalls of the recess and on a bottom surface of the recess, a passivation layer that includes boron (block 1140). For example, one or more of the semiconductor processing tools 102-116 may form, on sidewalls of the recess 608 and on a bottom surface of the recess 608, a passivation layer 312 that includes boron, as described herein.

As further shown in FIG. 11, process 1100 may include forming a gate dielectric layer over the passivation layer (block 1150). For example, one or more of the semiconductor processing tools 102-116 may form a gate dielectric layer 314 over the passivation layer 312, as described herein.

As further shown in FIG. 11, process 1100 may include forming a gate electrode (310), of a vertical transfer gate of the pixel sensor, in the recess over the passivation layer (block 1160). For example, one or more of the semiconductor processing tools 102-116 may form a gate electrode 310, of a vertical transfer gate 204 of the pixel sensor 202, in the recess 608 over the passivation layer 312, as described herein.

Process 1100 may include additional implementations, such as any single implementation or any combination of implementations described below and/or in connection with one or more other processes described elsewhere herein.

In a first implementation, forming the passivation layer 312 includes forming the passivation layer 312 such that a radius of curvature of the passivation layer 312 at the top corner of the recess is included in a range of approximately 10 nanometers to approximately 30 nanometers. In a second implementation, alone or in combination with the first implementation, the recess 608 is formed such that the top corner 402 of the recess 608 includes the combination of the (311) facet and the (111) facet, and process 1100 includes performing, after forming the passivation layer 312, a hydrochloric acid (HCl) based etch back operation on the passivation layer 312 to facilitate formation of the combination of the (311) facet and the (111) facet at the top corner 402 of the recess 608. In a third implementation, alone or in combination with one or more of the first and second implementations, the passivation layer 312 is doped with carbon.

In a fourth implementation, alone or in combination with one or more of the first through third implementations, forming the passivation layer 312 includes epitaxially growing the passivation layer 312 on the sidewalls of the recess 608 and on the bottom surface of the recess 608, performing, after epitaxially growing the passivation layer 312, an etch back operation to remove portions of the passivation layer 312, and performing, after performing the etch back operation, an annealing operation on the passivation layer 312. In a fifth implementation, alone or in combination with one or more of the first through fourth implementations, forming the passivation layer 312 includes epitaxially growing the passivation layer 312, performing the etch back operation, and performing the annealing operation in a single processing chamber without breaking a vacuum in the single processing chamber. In a sixth implementation, alone or in combination with one or more of the first through fifth implementations, a diffusion length of the passivation layer 312 into the substrate 302, after front end processing of the pixel sensor 202, is included in a range of approximately 70 nanometers to approximately 80 nanometers.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a boron (B) layer may be formed as a passivation layer in a recess in which a vertical transfer gate is to be formed. The recess may then be filled with a gate electrode of the vertical transfer gate over the passivation layer (and/or one or more intervening layers) to form the vertical transfer gate. The passivation layer may be formed in the recess by epitaxial growth. The use of epitaxy to grow the passivation layer enables precise control over the profile, uniformity, and/or boron concentration in the passivation layer. Moreover, the use of epitaxy to grow the passivation layer may reduce the diffusion length of the passivation layer into the substrate of the pixel sensor, which provides increased area in the pixel sensor for the photodiode. The increased area in the pixel sensor for the photodiode may enable the size of the photodiode to be increased, which may increase full well capacitance (FWC) for the vertical transfer gate.

As described in greater detail above, some implementations described herein provide a method. The method includes forming, in a substrate, a photodiode for a pixel sensor of a pixel array. The method includes forming, in the substrate, a drain region for the pixel sensor. The method includes forming, in the substrate, a recess adjacent to the drain region. The method includes epitaxially growing, on sidewalls of the recess and on a bottom surface of the recess, a passivation layer that includes boron. The method includes forming a gate dielectric layer over the passivation layer. The method includes forming a gate electrode, of a vertical transfer gate of the pixel sensor, in the recess over the passivation layer.

As described in greater detail above, some implementations described herein provide a pixel sensor. The pixel sensor includes a silicon substrate. The pixel sensor includes a photodiode in the silicon substrate. The pixel sensor includes a drain region in the silicon substrate. The pixel sensor includes a vertical transfer gate that extends into the silicon substrate, where the vertical transfer gate includes a gate electrode a passivation layer that includes boron, where the passivation layer is included between the silicon substrate and the gate electrode, and where a diffusion length of the passivation layer into the silicon substrate is less than a width of the gate electrode a gate dielectric layer between the passivation layer and the gate electrode.

As described in greater detail above, some implementations described herein provide a method. The method includes forming, in a substrate, a photodiode for a pixel sensor of a pixel array. The method includes forming, in the substrate, a drain region for the pixel sensor. The method includes forming, in the substrate, a recess adjacent to the drain region, where the recess is formed such that at least one of a top corner of the recess or a bottom corner of the recess includes a combination of a (311) facet and a (111) facet. The method includes forming, on sidewalls of the recess and on a bottom surface of the recess, a passivation layer that includes boron. The method includes forming a gate dielectric layer over the passivation layer. The method includes forming a gate electrode, of a vertical transfer gate of the pixel sensor, in the recess over the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, in a substrate, a photodiode for a pixel sensor of a pixel array;
    forming, in the substrate, a drain region for the pixel sensor;
    forming, in the substrate, a recess adjacent to the drain region,
      wherein a corner of the recess is a rounded corner having a radius of curvature included in a range of approximately 10 nanometers (nm) to approximately 30 nm;
    epitaxially growing, on sidewalls of the recess and on a bottom surface of the recess, a passivation layer that includes boron;
    forming a gate dielectric layer over the passivation layer; and
    forming a gate electrode, of a vertical transfer gate of the pixel sensor, in the recess over the passivation layer.

2. The method of claim 1, wherein epitaxially growing the passivation layer comprises:
epitaxially growing the passivation layer to a thickness that is included in a range of approximately 5 nanometers to approximately 15 nanometers.

3. The method of claim 1, wherein epitaxially growing the passivation layer comprises:
epitaxially growing the passivation layer at a temperature that is in a range of approximately 700 degrees Celsius to approximately 800 degrees Celsius.

4. The method of claim 1, wherein epitaxially growing the passivation layer comprises:
epitaxially growing the passivation layer at a pressure that is in a range of approximately 10 torr to approximately 100 torr.

5. The method of claim 1, wherein epitaxially growing the passivation layer comprises:
epitaxially growing the passivation layer using a diborane ($B_2H_6$) boron precursor.

6. The method of claim 1, further comprising:
performing, after epitaxially growing the passivation layer, an annealing operation to cause boron from the passivation layer to diffuse into the sidewalls and into the bottom surface of the recess.

7. The method of claim 6, wherein performing the annealing operation comprises:
performing the annealing operation at a temperature that is in a range of approximately 750 degrees Celsius to approximately 950 degrees Celsius.

8. The method of claim 1, wherein a diffusion length of the passivation layer into the substrate, after front end processing of the pixel sensor, is included in a range of approximately 70 nanometers to approximately 80 nanometers.

9. A method, comprising:
forming, in a substrate, a photodiode for a pixel sensor of a pixel array;
forming, in the substrate, a drain region for the pixel sensor;
forming, in the substrate, a recess adjacent to the drain region,
wherein the recess is formed such that at least one of a top corner of the recess or a bottom corner of the recess includes a combination of a (311) facet and a (111) facet;
forming, on sidewalls of the recess and on a bottom surface of the recess, a passivation layer that includes boron;
forming a gate dielectric layer over the passivation layer; and
forming a gate electrode, of a vertical transfer gate of the pixel sensor, in the recess over the passivation layer.

10. The method of claim 9, wherein forming the passivation layer comprises:
forming the passivation layer such that a radius of curvature of the passivation layer at the top corner of the recess is included in a range of approximately 10 nanometers to approximately 30 nanometers.

11. The method of claim 9, wherein the recess is formed such that the top corner of the recess includes the combination of the (311) facet and the (111) facet; and
wherein the method further comprises:
performing, after forming the passivation layer, a hydrochloric acid (HCl) based etch back operation on the passivation layer to facilitate formation of the combination of the (311) facet and the (111) facet at the top corner of the recess.

12. The method of claim 9, wherein the passivation layer is doped with carbon.

13. The method of claim 9, wherein forming the passivation layer comprises:
epitaxially growing the passivation layer on the sidewalls of the recess and on the bottom surface of the recess;
performing, after epitaxially growing the passivation layer, an etch back operation to remove portions of the passivation layer; and
performing, after performing the etch back operation, an annealing operation on the passivation layer.

14. The method of claim 13, wherein forming the passivation layer comprises:
epitaxially growing the passivation layer, performing the etch back operation, and performing the annealing operation in a single processing chamber without breaking a vacuum in the single processing chamber.

15. The method of claim 9, wherein a diffusion length of the passivation layer into the substrate, after front end processing of the pixel sensor, is included in a range of approximately 70 nanometers to approximately 80 nanometers.

16. A method, comprising:
forming, in a substrate, a photodiode for a pixel sensor of a pixel array;
forming, in the substrate, a drain region for the pixel sensor;
forming, on sidewalls and on a bottom surface of a portion of recess in the substrate adjacent to the drain region, a passivation layer that includes boron,
wherein a corner of the recess is rounded; and
forming a gate electrode, of a vertical transfer gate of the pixel sensor, over the passivation layer,
wherein the vertical transfer gate has an increased breakdown voltage based on the corner of the recess being rounded.

17. The method of claim 16, wherein forming the passivation layer comprises:
epitaxially growing the passivation layer.

18. The method of claim 16, further comprising:
performing, after forming the passivation layer, an etch back operation to remove portions of the passivation layer.

19. The method of claim 16, further comprising:
performing, after forming the passivation layer, an annealing operation on the passivation layer.

20. The method of claim 16, wherein the passivation layer is doped with carbon.

* * * * *